(12) United States Patent
Lu et al.

(10) Patent No.: US 12,727,247 B2
(45) Date of Patent: Sep. 1, 2026

(54) DRIVE SUBSTRATE AND PREPARATION METHOD THEREFOR, AND LIGHT-EMITTING APPARATUS

(71) Applicant: BOE Technology Group Co., Ltd., Beijing (CN)

(72) Inventors: Xinhong Lu, Beijing (CN); Chunfang Zhang, Beijing (CN); Xiaoyan Zhu, Beijing (CN); Shuang Sun, Beijing (CN); Shuilang Dong, Beijing (CN); Jingshang Zhou, Beijing (CN); Qi Qi, Beijing (CN); Hehe Hu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 472 days.

(21) Appl. No.: 18/274,897

(22) PCT Filed: Jul. 1, 2022

(86) PCT No.: PCT/CN2022/103455
§ 371 (c)(1),
(2) Date: Jul. 28, 2023

(87) PCT Pub. No.: WO2023/005610
PCT Pub. Date: Feb. 2, 2023

(65) Prior Publication Data

US 2024/0313007 A1 Sep. 19, 2024

(30) Foreign Application Priority Data

Jul. 30, 2021 (CN) ........................ 202110876291.0

(51) Int. Cl.
*G09F 9/30* (2006.01)
*H10D 86/01* (2025.01)
(Continued)

(52) U.S. Cl.
CPC ........... *H10D 86/60* (2025.01); *H10D 86/021* (2025.01); *H10D 86/451* (2025.01); *H10W 90/00* (2026.01)

(58) Field of Classification Search
CPC .... H10D 86/60; H10D 86/021; H10D 86/451; H01L 25/167; H01L 25/0753;
(Continued)

(56) References Cited

U.S. PATENT DOCUMENTS

2007/0077673 A1* 4/2007 Hwang ................ H10H 20/018 438/46
2014/0048778 A1* 2/2014 Park ....................... H05K 1/147 257/40

(Continued)

FOREIGN PATENT DOCUMENTS

CN 106024810 A 10/2016
CN 106711174 A 5/2017

(Continued)

OTHER PUBLICATIONS

Extended (Supplementary) European Search Report dated Sep. 24, 2024, issued in counterpart EP Application No. 22848215.4. (11 pages).

(Continued)

*Primary Examiner* — Donald L Raleigh
(74) *Attorney, Agent, or Firm* — WHDA, LLP

(57) ABSTRACT

A driving base plate includes a functional region (A) and a peripheral region (B) surrounding the functional region (A). Both the functional region (A) and the peripheral region (B) include a supporting substrate, and the functional region (A) further includes a flexible substrate and at least one protecting layer that are sequentially arranged on the supporting substrate. The region of the orthographic projection of the flexible substrate on the supporting substrate is located
(Continued)

within the region where the supporting substrate within the functional region (A) is located, and the protecting layer covers the surface of the flexible substrate further from the supporting substrate and the side of the flexible substrate close to the peripheral region (B). The adhesive force between the flexible substrate and the supporting substrate of the driving base plate is increased, and the reliability of the products manufactured by using the driving base plate is improved.

19 Claims, 11 Drawing Sheets

(51) Int. Cl.
*H10D 86/40* (2025.01)
*H10D 86/60* (2025.01)
*H10W 90/00* (2026.01)

(58) Field of Classification Search
CPC ...... H10H 20/857; H10H 20/84; G09F 9/301; G09F 9/33; G02F 1/133603; G09G 3/035; G09G 3/32; Y02E 10/549
See application file for complete search history.

(56) References Cited

U.S. PATENT DOCUMENTS

2015/0311468 A1* 10/2015 An ....................... H10K 77/111 438/26
2017/0020007 A1 1/2017 Park et al.
2017/0110687 A1 4/2017 Kim et al.
2018/0182840 A1 6/2018 Lin
2019/0326329 A1 10/2019 Fan et al.
2020/0251457 A1 8/2020 Huang et al.
2020/0266369 A1* 8/2020 Xu ......................... H10K 71/80
2021/0091318 A1* 3/2021 Zhu ...................... H10K 77/111
2021/0184077 A1 6/2021 Hu et al.
2022/0254972 A1 8/2022 Lu et al.

FOREIGN PATENT DOCUMENTS

CN 106783920 A 5/2017
CN 108333819 A 7/2018
CN 108428666 A 8/2018
CN 109326626 A 2/2019
CN 109830621 A 5/2019
CN 109860437 A 6/2019
CN 110325005 A 10/2019
CN 110391252 A 10/2019
CN 110741427 A 1/2020
CN 111508935 A 8/2020
CN 111524927 A 8/2020
CN 111584475 A 8/2020
KR 20150011584 A 2/2015
KR 10-20200069118 A 6/2020
WO 2009/011699 A1 1/2009

OTHER PUBLICATIONS

Office Action dated Nov. 21, 2024, issued in counterpart CN Application No. 202110876291.0, with English translation. (41 pages).
Song, Z. et al., A New Edge Blending Paradigm for Multi-Projector Tiled Display Wall, 2010 International Conference on Computer Application and System Modeling (ICCASM 2010), p. V5-349-V5-352. (4 pages).
Wei, Liang, A New Type of Narrow Seam Splicing and Reinforcing Display with Double Screen, Modern Industrial Economy and Informationization, vol. 188, No. 2, 2020, with English translation. (10 pages).
Notice of Reasons for Refusal dated Jun. 16, 2026, issued in counterpart JP Application No. 2023-556830, with English translation. (10 pages).

* cited by examiner

DRIVE SUBSTRATE AND PREPARATION METHOD THEREFOR, AND LIGHT-EMITTING APPARATUS

The present application claims the priority of the Chinese patent application filed on Jul. 30, 2021 before the Chinese Patent Office with the application number of 202110876291.0 and the title of "DRIVE SUBSTRATE AND PREPARATION METHOD THEREFOR, AND LIGHT-EMITTING APPARATUS", which is incorporated herein in its entirety by reference.

TECHNICAL FIELD

The present application relates to the technical field of displaying, and particularly relates to a driving base plate and a manufacturing method thereof, and a light emitting apparatus.

BACKGROUND

With the rapid development of the technique of displaying, display products of Mini LED (Mini Light Emitting Diode) and Micro LED (Micro Light Emitting Diode) have attracted broad attention. One of the advantages of the Micro/mini LED display products is that they can realize splicing with a large area, i.e., splicing of a plurality of driving base plates, thereby obtaining a display product of an extra-large size.

However, in the manufacturing of such a type of display products, the step of laser cutting results in reduction of the adhesive force between the flexible substrate and the supporting substrate on the lateral side of the driving base plate, and in a high-temperature high-humidity environment, the flexible substrate further absorbs water and thus is disengaged.

SUMMARY

The embodiments of the present application employ the following technical solutions:

In an aspect, there is provided a driving base plate, wherein the driving base plate comprises a functional region and a peripheral region surrounding the functional region;

both of the functional region and the peripheral region comprise a supporting substrate, and the functional region further comprises a flexible substrate and at least one protecting layer that are sequentially arranged on the supporting substrate; and a region of an orthographic projection of the flexible substrate on the supporting substrate is located within a region where the supporting substrate within the functional region is located, and the protecting layer covers a surface of the flexible substrate that is further from the supporting substrate and a side of the flexible substrate close to the peripheral region.

In some embodiments, a material of the protecting layer comprises an inorganic material.

In some embodiments, the protecting layer comprises a first buffer layer, and the first buffer layer covers the surface of the flexible substrate that is further from the supporting substrate and the side of the flexible substrate close to the peripheral region.

In some embodiments, a region of an orthographic projection of the first buffer layer on the supporting substrate overlaps with the peripheral region, and the first buffer layer directly contacts the supporting substrate within the peripheral region.

In some embodiments, the functional region further comprises a second buffer layer; and the second buffer layer is located between the flexible substrate and the first buffer layer, and an orthographic projection of the second buffer layer on the supporting substrate overlaps with the orthographic projection of the flexible substrate on the supporting substrate.

In some embodiments, the functional region and the peripheral region further comprise a second buffer layer;

the second buffer layer is located between the supporting substrate and the first buffer layer; and the second buffer layer covers at least the surface of the flexible substrate that is further from the supporting substrate and the side of the flexible substrate close to the peripheral region.

In some embodiments, the functional region and the peripheral region further comprise a first passivation layer; and an orthographic projection of the first passivation layer on the supporting substrate overlaps with an orthographic projection of the first buffer layer on the supporting substrate.

In some embodiments, the functional region further comprises a first organic layer, the first organic layer is located on one side of the first passivation layer that is further from the flexible substrate, and a region of an orthographic projection of the first organic layer on the supporting substrate does not overlap with the peripheral region.

In some embodiments, the orthographic projection of the first organic layer on the supporting substrate is located within the orthographic projection of the flexible substrate on the supporting substrate.

In some embodiments, the first organic layer covers the surface of the flexible substrate that is further from the supporting substrate and the side of the flexible substrate close to the peripheral region.

In some embodiments, a value of a distance from a side of the first organic layer close to the peripheral region to an edge of the driving base plate in a first direction is between 5-10 μm, wherein the first direction refers to a direction from the side of the flexible substrate close to the peripheral region pointing to the side of the first organic layer close to the peripheral region.

In some embodiments, the functional region and the peripheral region further comprise a first organic layer; and an orthographic projection of the first organic layer on the supporting substrate covers the orthographic projection of the flexible substrate on the supporting substrate, and further covers the orthographic projection on the supporting substrate of the first passivation layer located within the peripheral region.

In some embodiments, the functional region comprises a device disposing region, a bending region and a bonding region, and the bending region is located between the device disposing region and the bonding region;

all of the device disposing region, the bending region and the bonding region are provided with the flexible substrate, the first buffer layer and the first passivation layer; and all of the device disposing region, the bonding region and the peripheral region comprise a second passivation layer and a third passivation layer, the second passivation layer is located on one side of the first passivation layer that is further from the flexible substrate, an orthographic projection of the third passivation layer on the supporting substrate covers an orthographic projection of the second passivation layer on the supporting substrate, and neither of the orthographic projection of the second passivation layer on the supporting substrate and the orthographic projection of the third passivation layer on the supporting substrate overlaps with the orthographic projection on the supporting substrate of the flexible substrate within the bending region.

In some embodiments, all of the device disposing region, the bending region and the bonding region comprise a second organic layer;

the second organic layer within the device disposing region and the bonding region is located on one side of the third passivation layer that is further from the supporting substrate, and the second organic layer within the bending region is located on one side of the flexible substrate that is further from the supporting substrate; and an orthographic projection of the second organic layer on the supporting substrate is located within the orthographic projection of the flexible substrate on the supporting substrate.

In some embodiments, a distance between the side of the flexible substrate close to the peripheral region and a side of the second organic layer close to the peripheral region in a direction parallel to the supporting substrate is greater than or equal to 5 μm.

In some embodiments, the peripheral region further comprises the second organic layer; and the second organic layer within the peripheral region covers the third passivation layer within the peripheral region.

In some embodiments, a distance between a side of the flexible substrate close to the peripheral region and an edge of the driving base plate in a second direction is greater than or equal to 50 μm, wherein the second direction refers to a direction from the side of the flexible substrate close to the peripheral region pointing to a side of the protecting layer close to the peripheral region.

In some embodiments, the driving base plate further comprises a first conductive layer and a second conductive layer, the first conductive layer is located between the first buffer layer and the first passivation layer, and the second conductive layer is located between the second passivation layer and the third passivation layer; and the first conductive layer is located within the device disposing region, the bending region and the bonding region, and the second conductive layer is located within the device disposing region and the bonding region.

In some embodiments, the first conductive layer comprises a first lead wire and a second lead wire; and the first lead wire is located within the device disposing region, the second lead wire is located within the bending region, and two ends of the second lead wire extend from the bending region to the device disposing region and the bonding region.

In some embodiments, the second conductive layer comprises a first terminal, a second terminal, a third lead wire and a bonding terminal; and the first terminal, the second terminal and the third lead wire are located within the device disposing region, the bonding terminal is located within the bonding region, the first lead wire and the first terminal are electrically connected, and the second lead wire is electrically connected to the third lead wire and the bonding terminal.

In some embodiments, the functional region comprises a device disposing region, a bending region and a bonding region, and the bending region is located between the device disposing region and the bonding region; and the supporting substrate is located within the device disposing region and the bonding region, and the driving base plate within the bending region is configured to be capable of bending along a bending axis.

In another aspect, an embodiment of the present application further provides a light emitting apparatus, wherein the light emitting apparatus comprises a light emitting device, a circuit board and the driving base plate stated above; and the driving base plate is electrically connected to the light emitting device and the circuit board.

In yet another aspect, an embodiment of the present application further provides a method for manufacturing the driving base plate, wherein the method comprises:

providing a rigid mother-board substrate, wherein the rigid mother-board substrate is divided into at least two functional regions and a cutting region surrounding the functional regions;

forming the flexible substrate within the functional regions;

forming the at least one protecting layer, wherein the protecting layer is located within at least the functional regions, and the protecting layer covers a surface of the flexible substrate that is further from the rigid mother-board substrate and a side of the flexible substrate close to the cutting region; and cutting along a cutting line, to obtain at least one instance of the driving base plate, wherein the cutting line is located within the cutting region.

In some embodiments, the functional regions further comprise a second buffer layer; and the method further comprises:

forming the flexible substrate and the second buffer layer simultaneously within the functional regions, wherein the second buffer layer is located between the flexible substrate and the protecting layer, and an orthographic projection of the second buffer layer on the rigid mother-board substrate overlaps with an orthographic projection of the flexible substrate on the rigid mother-board substrate.

In some embodiments, the step of forming the flexible substrate and the second buffer layer simultaneously within the functional regions comprises:

forming a flexible thin film on the rigid mother-board substrate, wherein the flexible thin film is located within the functional regions and the cutting region;

forming a second buffer thin film on the flexible thin film, wherein the second buffer thin film covers the flexible thin film; and performing patterning treatment to the second buffer thin film and the flexible thin film simultaneously, to obtain the flexible substrate and the second buffer layer that are located within the functional regions.

In some embodiments, the protecting layer comprises a first buffer layer, and the step of forming the at least one protecting layer comprises:

forming the first buffer layer, wherein the first buffer layer is located within at least the functional regions, and the first buffer layer covers the surface of the flexible substrate that is further from the supporting substrate and the side of the flexible substrate close to the cutting region.

In some embodiments, after the step of forming the first buffer layer, and before the step of cutting along the cutting line, to obtain at least one instance of the driving base plate, the method further comprises:

forming a first conductive layer, wherein the first conductive layer is located on one side of the first buffer layer that is further from the rigid mother-board substrate, and the first conductive layer is located within the device disposing region, the bending region and the bonding region;

forming the first passivation layer on the first conductive layer, wherein the first passivation layer is located within a device disposing region, a bending region, a bonding region and the cutting region; and forming a first organic layer on the first passivation layer, wherein the first organic layer does not overlap with the rigid mother-board substrate within the cutting region in a direction perpendicular to the flexible substrate.

In some embodiments, the step of forming the first organic layer on the first passivation layer comprises:

forming a first organic thin film on the first passivation layer; and performing patterning treatment to the first organic thin film, to obtain the first organic layer, wherein an orthographic projection of the first organic layer on the rigid mother-board substrate is located within an orthographic projection of the flexible substrate on the rigid mother-board substrate, or the first organic layer covers the surface of the flexible substrate that is further from the rigid mother-board substrate and a side of the flexible substrate close to the cutting regions.

In some embodiments, after the step of forming the first organic layer on the first passivation layer, and before the step of cutting along the cutting line, to obtain at least one instance of the driving base plate, the method further comprises:

forming a second passivation layer on the first organic layer;

forming a second conductive layer on the second passivation layer, wherein the second conductive layer is located within the device disposing region and the bonding region;

forming a third passivation layer on the second conductive layer, wherein both of the second passivation layer and the third passivation layer are located within the device disposing region, the bonding region and the cutting region; and forming a second organic layer on the third passivation layer, wherein an orthographic projection of the second organic layer on the rigid mother-board substrate intersects or overlaps with at least an orthographic projection of the flexible substrate on the rigid mother-board substrate.

The above description is merely a summary of the technical solutions of the present application. In order to more clearly know the elements of the present application to enable the implementation according to the contents of the description, and in order to make the above and other purposes, features and advantages of the present application more apparent and understandable, the particular embodiments of the present application are provided below.

BRIEF DESCRIPTION OF THE DRAWINGS

In order to more clearly illustrate the technical solutions of the embodiments of the present application or the related art, the figures that are required to describe the embodiments or the related art will be briefly described below. Apparently, the figures that are described below are embodiments of the present application, and a person skilled in the art can obtain other figures according to these figures without paying creative work.

In order to more clearly illustrate the technical solutions of the embodiments of the present application or the related art, the figures that are required to describe the embodiments or the related art will be briefly described below. Apparently, the figures that are described below are merely embodiments of the present application, and a person skilled in the art can obtain other figures according to these figures without paying creative work.

FIGS. 11*a*-16*b* are schematic diagrams of the intermediate structures in the manufacturing process of the driving base plate according to the embodiments of the present application.

DETAILED DESCRIPTION

Figure 1A:
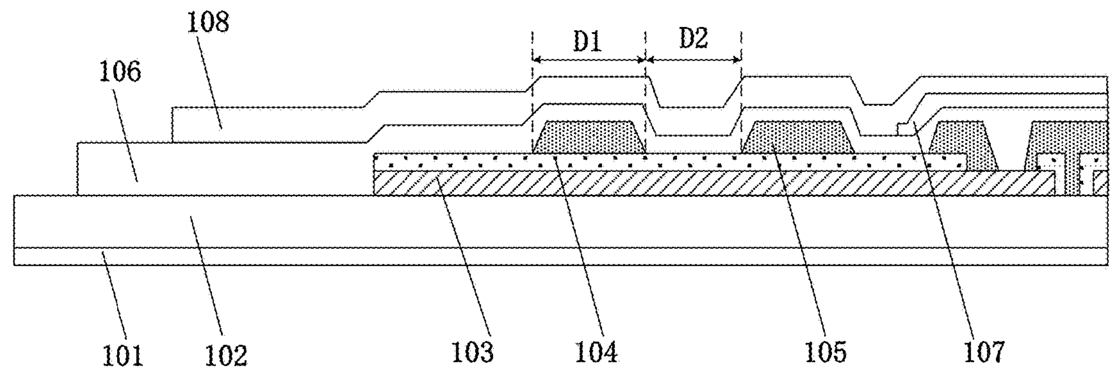
FIGS. 1*a* and 1*b* are schematic structural diagrams of driving base plates in the related art.

The technical solutions of the embodiments of the present application will be clearly and completely described below with reference to the drawings of the embodiments of the present application. Apparently, the described embodiments are merely certain embodiments of the present application, rather than all of the embodiments. All of the other embodiments that a person skilled in the art obtains on the basis of the embodiments of the present application without paying creative work fall within the protection scope of the present application.

In the embodiments of the present application, unless stated otherwise, the meaning of "plurality of" is "two or more". The terms that indicate orientation or position relations, such as "upper", are based on the orientation or position relations shown in the drawings, and are merely for conveniently describing the present application and simplifying the description, rather than indicating or implying that the component or element must have the specific orientation and be constructed and operated according to the specific orientation. Therefore, they should not be construed as a limitation on the present application.

In order to facilitate the clear description on the technical solutions of the embodiments of the present application, in the embodiments of the present application, terms such as "first", "second" and "third" are used to distinguish identical items or similar items that have substantially the same functions and effects, and a person skilled in the art can understand that the terms such as "first", "second" and "third" do not limit the quantity.

The base-plate bending technique refers to a displaying technique in which the base plate of a display product is bent, so as to arrange the non-displaying region and the displaying region in different planes, to increase the screen-to-body ratio.

The inventor has found that, in the base-plate bending technique, usually the displaying elements may be provided on a substrate made from an organic material. Because the lateral side of the substrate is exposed, the characteristic of the organic material of easy water absorption results in that the adhesive force between the area of the flexible substrate close to the edge and the other components of the display product (for example, the supporting substrate for supplying the supporting) is reduced, and even swelling and disengagement between the supporting substrate and part of the flexible substrate happen, which results in decreasing of the yield of the display product.

FIG. 1*a* shows the film-layer structure of a display product in the related art. An insulating-material layer 102, a source-drain metal layer 103, a passivation layer 104 and a plurality of insulating blocking parts 105 are provided on a flexible substrate 101, and a first packaging layer 106, a second packaging layer 107 and a third packaging layer 108 are provided on the insulating blocking parts 105. In addition, in some flexible display products, a via hole (not shown in FIG. 1*a*) for communicating the electrically conducting patterns located in the different film layers is provided in the insulating blocking parts 105. Accordingly, the size D1 of the insulating blocking parts 105 within the peripheral region of the display product cannot be too low, and the distance D2 between two neighboring insulating blocking parts 105 is usually 40 μm±10 μm, which causes that the display product has a large border frame. Therefore, the display products employing the above-described film-layer configuration are not suitable for forming the display products for splicing.

Figure 1B:
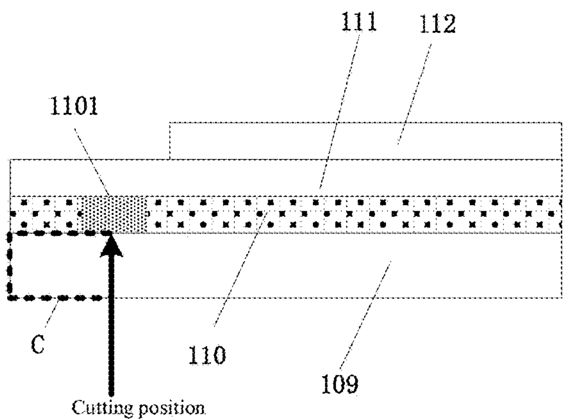

FIG. 1*b* shows a schematic structural diagram of a peripheral local region of a display product manufactured by using the base-plate bending technique in the related art before the base-plate bending technique is employed. The peripheral region of that display product comprises a supporting substrate 109, a flexible substrate 110, a composite packaging film 111 and a black-adhesive protecting layer 112. Before the base-plate bending technique is employed, it is required to strip the region C in the supporting substrate 109 within the peripheral region and the film layers within the region C by laser cutting. Because the laser cutting generates heat, it influences the region 1101 at the corresponding cutting position in the flexible substrate 110, and deteriorates the adhesive force between the flexible substrate 110 and the supporting substrate 109. Accordingly, when the display product is placed in a moist environment, the dual influence by the heat and water vapor aggravates the problem of swelling and disengagement between the flexible substrate 110 and the supporting substrate 109. In practical applications, after a high-temperature high-humidity storage (THS) verification test on a display product in the related art, the flexible substrate 110 and the supporting substrate 109 of the display product have obvious swelling and disengagement. It should be noted that the area of the region 1101 affected by the heat generated by the laser cutting is the area with the distance from the cutting line in the range of 0-50 μm.

Referring to FIG. 2*a*, 3*a*, 4*a*, 5 or 6, an embodiment of the present application provides a driving base plate, wherein the driving base plate comprises a functional region A and a peripheral region B surrounding the functional region A. Both of the functional region A and the peripheral region B of the driving base plate comprise a supporting substrate 1, and the functional region A of the driving base plate further comprises a flexible substrate 2 and at least one protecting layer that are sequentially arranged on the supporting substrate 1.

The region of the orthographic projection of the flexible substrate 2 on the supporting substrate 1 is located within the region where the supporting substrate 1 within the functional region A is located, and the protecting layer covers the surface of the flexible substrate 2 that is further from the supporting substrate 1 and the side of the flexible substrate 2 close to the peripheral region B.

The functional region A may comprise a device disposing region A1, a bending region A2 and a bonding region A3. The device disposing region A1 refers to the region for the provision of the light emitting device. The bending region A2 refers to the region for bending. The bonding region A3 is provided with a fanning-out trace whose one end is used to be connected to a signal line that extends throughout the device disposing region A1 and the bending region A2, and a bonding electrode connected to the other end of the fanning-out trace, and the bonding electrode is used to be bonded to and connected to the circuit board. It should be noted that, in practical applications, if the driving base plate is required to be bent, then it is required to, before the bending, remove at least the supporting substrate 1 located within the bending region A2 shown in FIG. 2*a*. For example, that may comprise, as shown in FIG. 4*c*, merely removing the supporting substrate 1 located within the bending region A2, and may also comprise removing the supporting substrate 1 comprising part of the area of the bonding region A3 that is adjacent to the bending region A2, provided that the reliability of the subsequent bonding process of the circuit board and the bonding region is not deteriorated, which is not limited in the present application.

The peripheral region B refers to a buffer region that is reserved between the functional region A and the boundary of the driving base plate in the process of the manufacturing of the driving base plate. In practical applications, the size of the peripheral region B may be decided according to the practical cutting process.

Figure 7A:
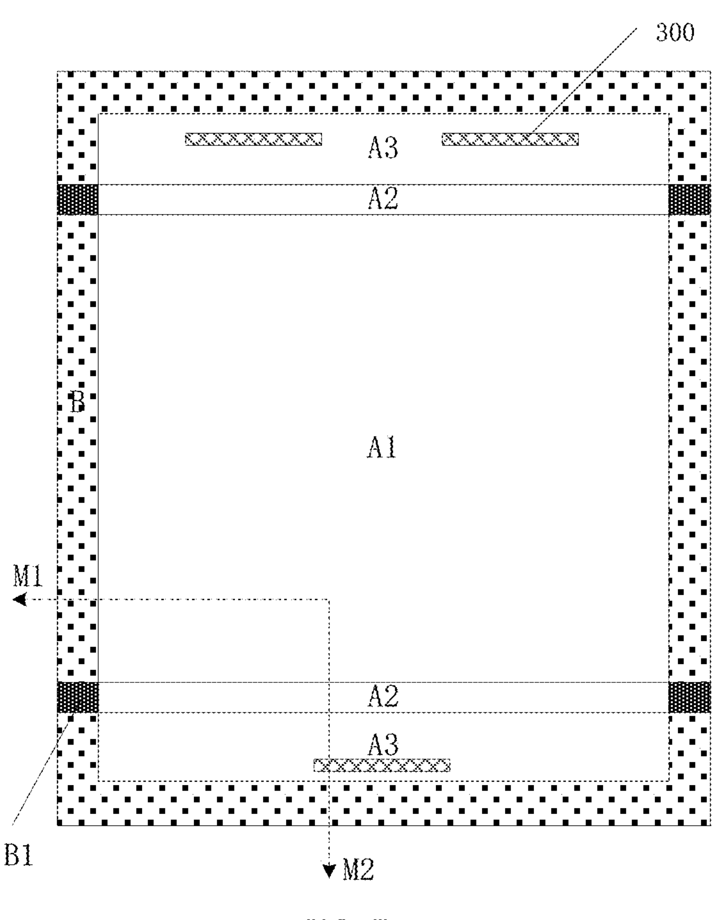

In practical applications, referring to FIG. 7*a*, by providing the flexible substrate 2 within the functional region A (comprising A1, A2 and A3 in FIG. 7*a*), and not providing the flexible substrate 2 within the peripheral region B, the flexible substrate 2 does not overlap with the supporting substrate 1 within the peripheral region B in the direction perpendicular to the supporting substrate 1. Subsequently, the at least one protecting layer is provided, and the protecting layer covers the surface of the flexible substrate 2 that is further from the supporting substrate 1 and the side of the flexible substrate 2 close to the peripheral region B, to protect the side of the flexible substrate 2 from being affected by water vapor.

The at least one protecting layer means that the protecting layer is of a monolayer structure or is of a tandem structure formed by a plurality of film layers, and at least one layer of the protecting layer covers the surface of the flexible substrate 2 that is further from the supporting substrate 1 and the side of the flexible substrate 2 close to the peripheral region B, to protect the flexible substrate 2 from being affected by water and oxygen. It should be noted that, if the protecting layer is of a monolayer structure, the protecting layer may be the first buffer layer 4 shown in FIG. 5, or the protecting layer may be the second buffer layer 3 shown in FIG. 5, or the protecting layer may also be the first passivation layer 6 shown in FIG. 5.

If the protecting layer can protect the flexible substrate 2, so as to prevent swelling and disengagement between the flexible substrate 2 and the supporting substrate 1, the particular material of the protecting layer is not limited herein.

Figure 2A:
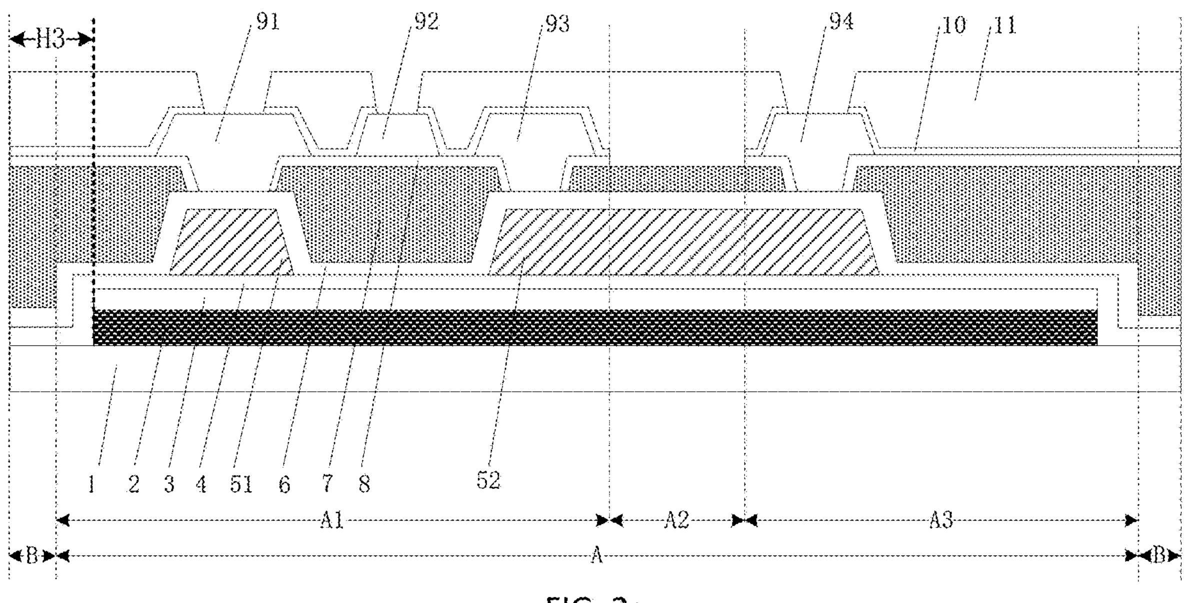
FIGS. 2*a*, 3*a*, 4*a*, 4*c* and 5-7*c* are schematic structural diagrams of nine types of the driving base plate according to the embodiments of the present application.
Figure 2B:
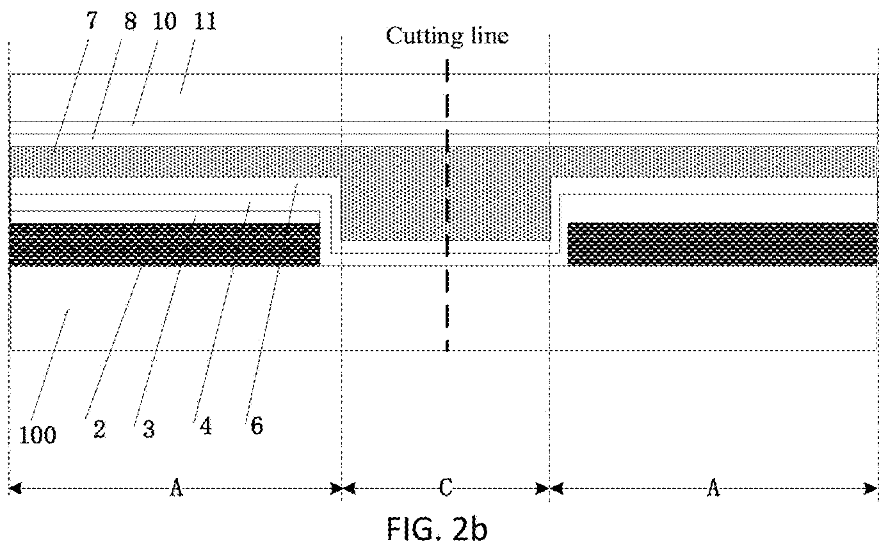
FIGS. 2*b*, 3*b* and 4*b* are schematic structural diagrams of the mother boards of three types of the driving base plate according to the embodiments of the present application.

It should be noted that, because the protecting layer located within the functional region A covers the side of the flexible substrate 2 close to the peripheral region B, and the side of the protecting layer has a certain thickness, in practical applications, referring to FIG. 2*a*, the region of the orthographic projection of the flexible substrate 2 on the supporting substrate 1 is located within the region where the supporting substrate 1 within the functional region A is located.

In some embodiments, the material of the supporting substrate 1 may be any one of glass, quartz, PET, plastic and so on. The material of the flexible substrate 2 may be any one of polyimide, a PEN resin and a silica-gel resin. The thickness of the supporting substrate 1 may be 0.5 mm-0.8 mm. The thickness of the flexible substrate 2 may be 3 μm-10 μm.

An embodiment of the present application provides a driving base plate, wherein the driving base plate comprises a functional region A and a peripheral region B surrounding the functional region A. Both of the functional region A and the peripheral region B of the driving base plate comprise a supporting substrate 1, and the functional region A of the driving base plate further comprises a flexible substrate 2 and at least one protecting layer that are sequentially arranged on the supporting substrate 1. The region of the orthographic projection of the flexible substrate 2 on the supporting substrate 1 is located within the region where the supporting substrate 1 within the functional region A is located, and the protecting layer covers the surface of the flexible substrate 2 that is further from the supporting substrate 1 and the side of the flexible substrate 2 close to the peripheral region B.

Accordingly, because the protecting layer covers the surface of the flexible substrate 2 that is further from the supporting substrate 1 and the side of the flexible substrate 2 close to the peripheral region B, it is prevented that the side of the flexible substrate 2 contacts the water vapor in the environment, thereby increasing the adhesive force between the part of the flexible substrate 2 close to the peripheral region B and the supporting substrate 1, and ameliorating the problem of swelling and disengagement between the part of the flexible substrate 2 close to the peripheral region B and the supporting substrate 1, which improves the reliability of the display products manufactured by using the driving base plate.

It should also be noted that, because inorganic materials excellently isolate water vapor, in practical applications, the material of the protecting layer comprises an inorganic material.

In some embodiments, referring to FIG. 2*a*, the protecting layer comprises a first buffer layer 4, and the first buffer layer 4 covers the surface of the flexible substrate 2 that is further from the supporting substrate 1 and the side of the flexible substrate 2 close to the peripheral region B.

In some embodiments, the region of the orthographic projection of the first buffer layer 4 on the supporting substrate 1 intersects or overlaps with the peripheral region B, and the first buffer layer 4 and the supporting substrate 1 that is located within the peripheral region B have parts that directly contact.

In practical applications, it is required to ensure that the first buffer layer 4 and the flexible substrate 2 have a good adhesive force therebetween, and the material of the first buffer layer 4 may be silicon oxide and/or silicon nitride. Additionally, taking into consideration the folding stress of the material, the thickness of the first buffer layer 4 may be 500 Å-1000 Å.

In some embodiments, the material of the first buffer layer 4 is silicon oxide, and the thickness is 500 Å. Alternatively, the material of the first buffer layer 4 is silicon nitride, and the thickness is 500 Å. Alternatively, the first buffer layer 4 comprises two sublayers of the equal thicknesses, the materials of the two sublayers are silicon oxide and silicon nitride, and the thickness of each of the sublayers is 500 Å, or, in other words, the thickness of the first buffer layer 4 is 1000 Å, wherein the sublayer whose material is silicon oxide may directly contact the flexible substrate 2, or the sublayer whose material is silicon nitride may directly contact the flexible substrate 2.

In the driving base plate according to the present application, by causing the first buffer layer 4 to cover the surface of the flexible substrate 2 that is further from the supporting substrate 1, and further cover the side of the flexible substrate 2 close to the peripheral region B, it is prevented that the side of the flexible substrate 2 contacts the water vapor in the environment, thereby increasing the adhesive force between the part of the flexible substrate 2 close to the peripheral region B and the supporting substrate 1, and ameliorating the problem of swelling and disengagement between the part of the flexible substrate 2 close to the peripheral region B and the supporting substrate 1, which improves the reliability of the driving base plate.

In some embodiments, the driving base plate further comprises the second buffer layer 3.

In some embodiments, referring to FIG. 2*a*, the functional region A of the driving base plate comprises a second buffer layer 3, the second buffer layer 3 is located between the flexible substrate 2 and the first buffer layer 4, and the orthographic projection of the second buffer layer 3 on the supporting substrate 1 overlaps with the orthographic projection of the flexible substrate 2 on the supporting substrate 1.

The manufacturing of the driving base plate may comprise spread-coating the flexible thin film and the second buffer thin film sequentially on the supporting substrate 1, and, subsequently, by using the second buffer thin film as the hard mask, performing patterning treatment to the second buffer thin film and the flexible thin film simultaneously, thereby forming the flexible substrate 2 having an angle of gradient (Profile) of 90°.

It should be noted that, because the second buffer layer 3 serves as the hard mask of the flexible substrate 2 and they simultaneously undergo the patterning treatment, in practical applications, the second buffer layer 3 and the flexible substrate 2 have the same shape and size.

Figure 5:
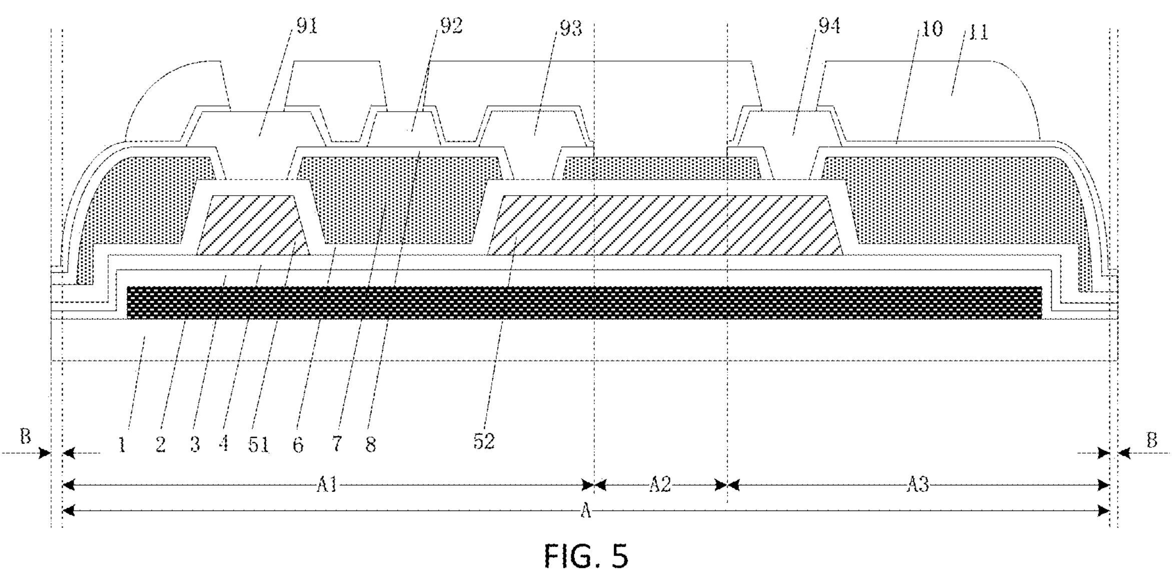

In some embodiments, referring to FIG. 5, the functional region A and the peripheral region B of the driving base plate comprise a second buffer layer 3, and the second buffer layer 3 is located between the supporting substrate 1 and the first buffer layer 4. The second buffer layer 3 covers at least the surface of the flexible substrate 2 that is further from the supporting substrate 1 and the side of the flexible substrate 2 close to the peripheral region B.

Because the second buffer layer 3 covers the side of the flexible substrate 2 close to the peripheral region B, and subsequently the first buffer layer 4 is provided on the second buffer layer 3, the first buffer layer 4 also covers the side of the flexible substrate 2 close to the peripheral region B, which further improves the effect of the blocking of water vapor, and prevents that the side of the flexible substrate 2 contacts the water vapor in the environment, thereby increasing the adhesive force between the part of the flexible substrate 2 close to the peripheral region B and the supporting substrate 1, and ameliorating the problem of swelling and disengagement between the part of the flexible substrate 2 close to the peripheral region B and the supporting substrate 1, which improves the reliability of the driving base plate.

The material of the second buffer layer 3 may be silicon nitride (SiNx). The thickness of the second buffer layer 3 may range 500 Å-1500 Å.

In some embodiments, referring to FIG. 2*a*, the functional region A and the peripheral region B of the driving base plate further comprise a first passivation layer (PVX1) 6. The orthographic projection of the first passivation layer 6 on the supporting substrate 1 intersects or overlaps with the orthographic projection of the first buffer layer 4 on the supporting substrate 1.

The material of the first passivation layer 6 may be silicon nitride (SiNx). The thickness of the first passivation layer 6 may range 1000 Å-2000 Å.

In the driving base plate according to the embodiment of the present application, by further providing the first passivation layer 6 on the first buffer layer 4, wherein the orthographic projection of the first passivation layer 6 on the supporting substrate 1 and the orthographic projection of the first buffer layer 4 on the supporting substrate 1 overlap, the first passivation layer 6 also covers the side of the flexible substrate 2 close to the peripheral region B, thereby further improving the effect of the blocking of water vapor, and preventing the problem of swelling and disengagement caused by contacting of the side of the flexible substrate 2 with the water vapor in the environment.

Figure 3A:
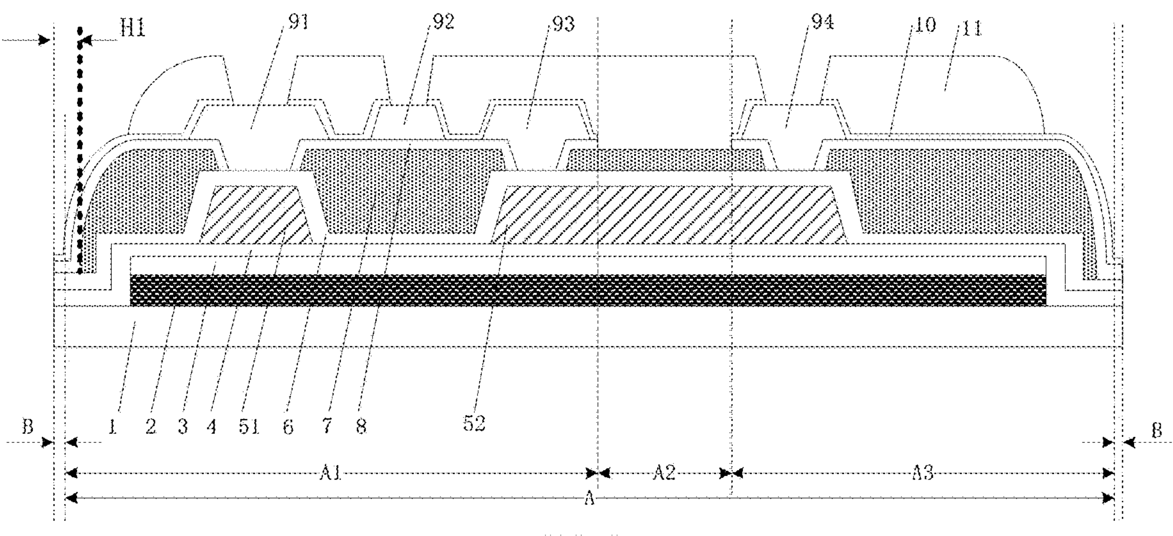
Figure 4A:
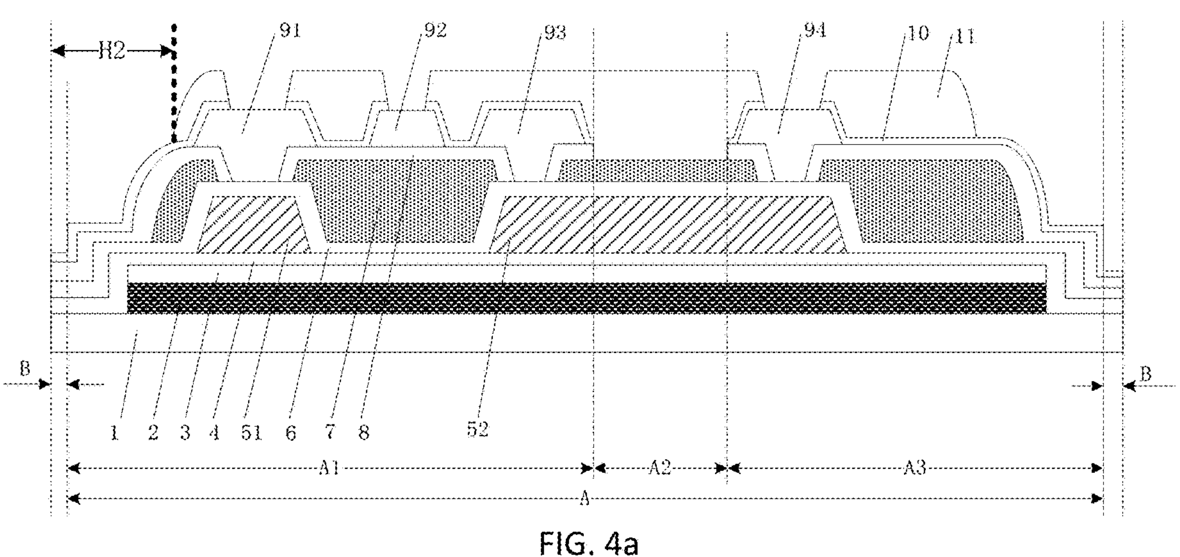

In some embodiments, referring to FIGS. 2*a*, 3*a* and 4*a*, the functional region A of the driving base plate further comprises a first organic layer 7, the first organic layer 7 is located on the side of the first passivation layer 6 that is further from the flexible substrate 2, and the region of the orthographic projection of the first organic layer 7 on the supporting substrate 1 does not overlap with the peripheral region B.

In some embodiments, referring to FIG. 4*a*, the orthographic projection of the first organic layer 7 on the supporting substrate 1 is located within the orthographic projection of the flexible substrate 2 on the supporting substrate 1.

Figure 4B:
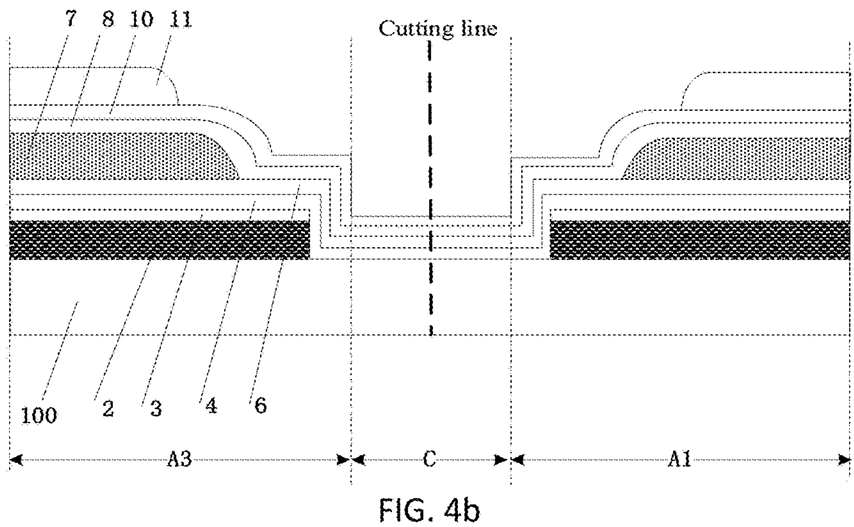
Figure 4C:
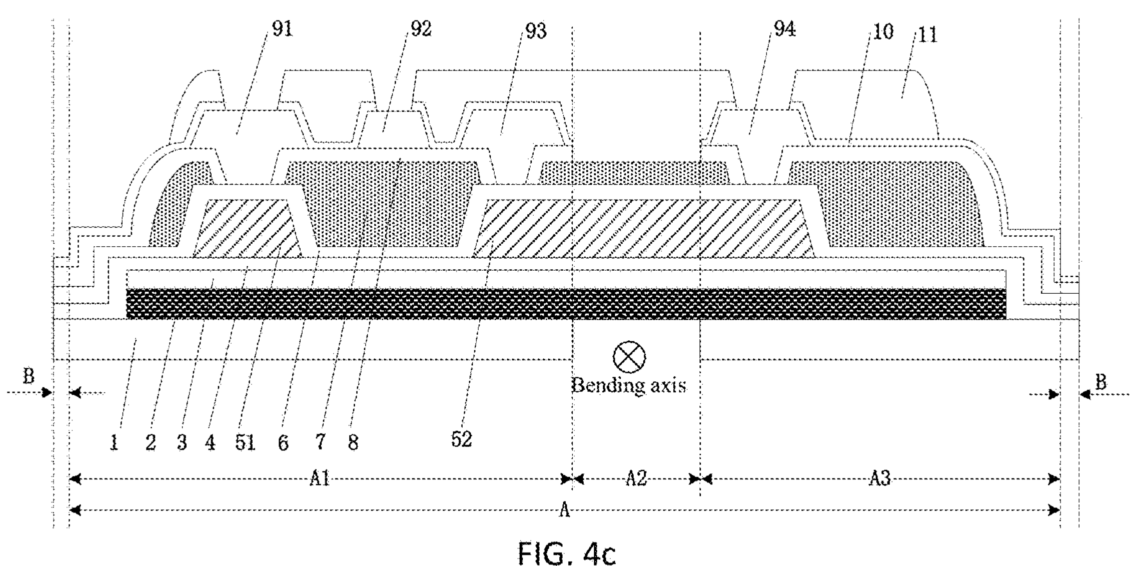

In practical applications, usually, on a rigid mother-board substrate having a large area size, a plurality of functional regions A are manufactured by using a semiconductor manufacturing process, and the rigid mother-board substrate and the functional regions A thereon are scribed and cut along a cutting line, whereby the plurality of functional regions A are separated from each other, to form a plurality of driving base plates. FIG. 4*b* illustrates a schematic structural diagram of a mother board comprising two driving base plates. By cutting at the cutting line shown in FIG. 4*b*, two driving base plates shown in FIG. 4*a* can be obtained.

Accordingly, in the manufacturing of the driving base plate, when the mother board of the driving base plate is cut to obtain the driving base plate, the distance between the side of the first organic layer 7 close to the peripheral region B and the edge of the driving base plate is at least greater than the distance between the side of the flexible substrate 2 close to the peripheral region B and the cutting line, thereby preventing the heat caused by the cutting from affecting the first organic layer 7, and reducing the difficulty in the cutting process.

In some embodiments, referring to FIG. 3*a*, the first organic layer 7 covers the surface of the flexible substrate 2 that is further from the supporting substrate 1 and the side of the flexible substrate 2 close to the peripheral region B.

In some embodiments, the value of the distance H1 from the side of the first organic layer 7 close to the peripheral region B to the edge of the driving base plate in a first direction is between 5-10 μm, wherein the first direction refers to the direction from the side of the flexible substrate 2 close to the peripheral region B pointing to the side of the first organic layer 7 close to the peripheral region B.

In the driving base plate according to the embodiment of the present application, the first organic layer 7 covers the side of the flexible substrate 2 close to the peripheral region B. In an aspect, the first organic layer 7 serves to protect the side of the flexible substrate 2 close to the peripheral region B. In another aspect, because the first organic layer 7 is manufactured by using an organic material, the levelling property of the organic material causes the side of the first organic layer 7 close to the peripheral region B to form a small angle of gradient (for example, 50°±10°. Accordingly, when subsequently a second passivation layer 8 and a third passivation layer 10 shown in FIG. 3*a* are being formed on the first organic layer 7, the second passivation layer 8 and the third passivation layer 10 have a good deposition coverage property at the position of the side, which prevents the problem of cracking of the second passivation layer 8 and the third passivation layer 10 at the position of the side of the first organic layer 7 close to the peripheral region B caused by unstable film-formation processes.

Figure 3B:
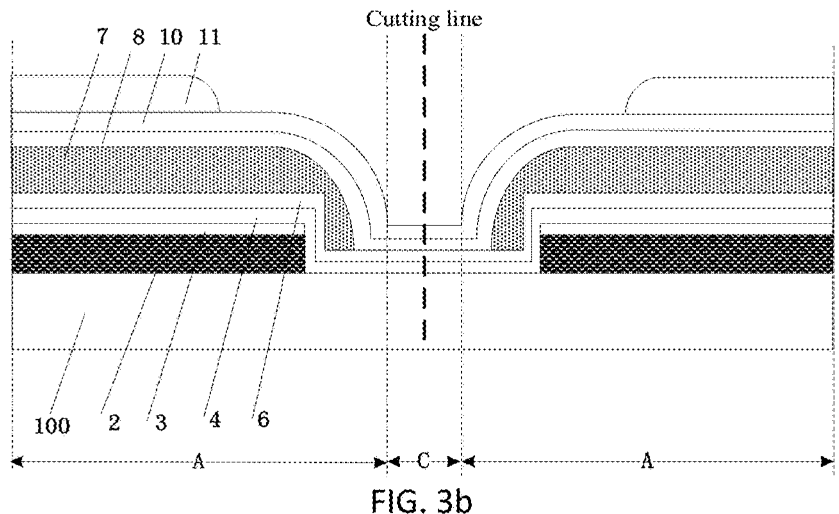

Optionally, referring to FIG. 3*a*, the value of the distance H1 from the side of the first organic layer 7 close to the peripheral region B to the edge of the driving base plate in the first direction is in the range of 5-10 μm. Therefore, in the manufacturing of the driving base plate, when the mother board is cut to obtain the driving base plate, the first organic layer 7 is far from the cutting line (i.e., the outer contour of the peripheral region B), thereby preventing the heat caused by the cutting from affecting the first organic layer 7, and reducing the difficulty in the cutting process. FIG. 3*b* shows Part of the structure of the mother board for manufacturing the driving base plate shown in FIG. 3*a*. By cutting at the cutting line shown in FIG. 3*b*, two driving base plates shown in FIG. 3*a* can be obtained.

In some embodiments, referring to FIG. 2*a*, the functional region A and the peripheral region B of the driving base plate further comprise a first organic layer 7, the orthographic projection of the first organic layer 7 on the supporting substrate 1 covers the orthographic projection of the flexible substrate 2 on the supporting substrate 1, and further covers the orthographic projection on the supporting substrate 1 of the first passivation layer 6 located within the peripheral region B.

In the driving base plate according to the embodiment of the present application, by forming the first organic layer 7 of the whole layer, which means that the first organic layer 7 is located within the functional region A, and is also located within the peripheral region B, the manufacturing process is simplified, and the difficulty in the manufacturing of the driving base plate is reduced.

In some embodiments, referring to FIGS. 4*a* and 7*a*, the functional region A comprises a device disposing region A1, a bending region A2 and a bonding region A3, and the bending region A2 is located between the device disposing region A1 and the bonding region A3. All of the device disposing region A1, the bending region A2 and the bonding region A3 are provided with the flexible substrate 2, the first buffer layer 4 and the first passivation layer 6.

All of the device disposing region A1, the bonding region A3 and the peripheral region B of the driving base plate further comprise a second passivation layer (PVX2) 8 and a third passivation layer (PVX3) 10, the second passivation layer 8 is located on the side of the first passivation layer 6 that is further from the flexible substrate 2, the orthographic projection of the third passivation layer 10 on the supporting substrate 1 covers the orthographic projection of the second passivation layer 8 on the supporting substrate 1, and neither of the orthographic projection of the second passivation layer 8 on the supporting substrate 1 and the orthographic projection of the third passivation layer 10 on the supporting substrate 1 overlaps with the orthographic projection on the supporting substrate 1 of the flexible substrate 2 within the bending region A2. It should be noted that FIG. 4*a* is a cross-sectional view of FIG. 7*a* along M1M2.

In the driving base plate according to the embodiment of the present application, because the orthographic projection of the first passivation layer 6 on the supporting substrate 1 and the orthographic projection of the first buffer layer 4 on the supporting substrate 1 overlap, when subsequently the second passivation layer 8 and the third passivation layer 10 are provided on the first passivation layer 6, the orthographic projections on the supporting substrate 1 of the second passivation layer 8 and the third passivation layer 10 that are located within the device disposing region A1, the bonding region A3 and the peripheral region B also overlap with the orthographic projection of the first buffer layer 4 on the supporting substrate 1, so that the second passivation layer 8 and the third passivation layer 10 also cover the side of the flexible substrate 2 close to the peripheral region B, thereby further improving the effect of the blocking of water vapor, and preventing the problem of swelling and disengagement caused by contacting of the side of the flexible substrate 2 with the water vapor in the environment.

In addition, the second passivation layer 8 and the third passivation layer 10 are not provided within the bending region A2, to reduce the overall film-layer thickness within the bending region A2, and reduce the folding stress of the driving base plate in bending.

In some embodiments, referring to FIG. 4*a*, all of the device disposing region A1, the bending region A2 and the bonding region A3 of the driving base plate comprise a second organic layer 11. The second organic layer 11 within the device disposing region A1 and the bonding region A3 is located on the side of the third passivation layer 10 that is further from the supporting substrate 1, and the second organic layer 11 within the bending region A2 is located on the side of the flexible substrate 2 that is further from the supporting substrate 1. The orthographic projection of the second organic layer 11 on the supporting substrate 1 is located within the orthographic projection of the flexible substrate 2 on the supporting substrate 1.

Figure 17:
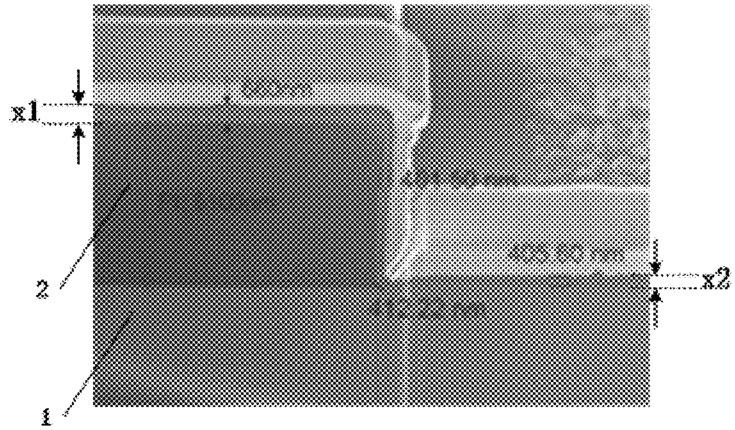
FIG. 17 is a diagram of the scanning-electron-microscope data of a driving base plate according to an embodiment of the present application.

FIG. 17 provides a diagram of the scanning-electron-microscope data at the position of the side of the flexible substrate 2 of the driving base plate close to the peripheral region B shown in FIG. 4*a*. Referring to FIG. 17, the flexible substrate 2 is located on the supporting substrate 1, and the thickness of the flexible substrate 2 (PI) is 6100 nm. The film layers on the flexible substrate 2 are sequentially the second buffer layer 3 and the first buffer layer 4, and the sum x1 of their thicknesses is 660 nm. The film layer covering the side of the flexible substrate 2 close to the peripheral region B is the first buffer layer 4, and its thickness is 401.5 nm. The film layer located on the supporting substrate 1 within the peripheral region B is the first buffer layer 4, and its thickness x2 is 405.6 nm. It is obtained by test that the film-layer coverage property of the first buffer layer 4 adjacent to the right-angle position can reach above 60%, no film-layer cracking of the first buffer layer 4 happens, and its coverage thickness can reach 3000-4000 Å, which can satisfy the requirement on isolating water and oxygen. In addition, the driving base plate shown in FIG. 4*a* undergoes a high-temperature high-humidity reliability test in the conditions of 60° C. and 90% humidity for 1000 hours, and no problem of swelling between the flexible substrate 2 and the supporting substrate 1 and disengagement of the film layers happens, which satisfies the usage requirements on the product, and ensures the quality.

It should be noted that the coverage property means the ratio of the thickness of the first buffer layer 4 on the side of the flexible substrate 2 close to the peripheral region B to the thickness of the first buffer layer 4 located on the surface of the flexible substrate 2 that is further from the supporting substrate 1. The indicator of the coverage property is used to evaluate the film-formation quality of the first buffer layer 4 adjacent to the position having the slope (adjacent to the right-angle position in FIG. 17).

In the driving base plate according to the embodiment of the present application, by providing the second organic layer 11 on the third passivation layer 10, it can serve as the planarization layer within the functional region A, to serve for planarization and insulation. In addition, the orthographic projection of the second organic layer 11 on the supporting substrate 1 is located within the orthographic projection of the flexible substrate 2 on the supporting substrate 1, which prevents, in the manufacturing of the driving base plate, the heat generated when the mother board of the driving base plate is cut to obtain the driving base plate from affecting the second organic layer 11, and reducing the difficulty in the cutting process.

In practical applications, referring to FIG. 4*a*, in order to facilitate the manufacturing, the distance H2 between the side of the flexible substrate 2 close to the peripheral region B and the side of the second organic layer 11 close to the peripheral region B in the direction parallel to the supporting substrate 1 is set to be greater than or equal to 5 μm.

In some embodiments, referring to FIG. 2*a*, the peripheral region B of the driving base plate further comprises the second organic layer 11, and the second organic layer 11 within the peripheral region B covers the third passivation layer 10 within the peripheral region B.

It should be noted that, if the influence on the driving base plate by the heat generated in the cutting process is very small (for example, when a laser-cutting process that generates a heat-affected zone of a very small size is employed, or when knife-flywheel cutting or another cutting mode is employed), by providing the second organic layer 11 as a whole layer within the functional region A and the peripheral region B of the driving base plate, the step of removing the second organic layer 11 within the peripheral region B (or performing the patterning treatment to the second organic layer 11) can be omitted, to shorten the duration of the manufacturing of the driving base plate, and increase the production efficiency.

In some embodiments, referring to FIG. 2*a*, the distance H3 between the side of the flexible substrate 2 close to the peripheral region B and the edge of the driving base plate in a second direction is greater than or equal to 50 μm, wherein the second direction refers to the direction from the side of the flexible substrate 2 close to the peripheral region B pointing to the side of the protecting layer close to the peripheral region B.

In the related art, when the mother board of the driving base plate is cut to obtain the driving base plate, the width of the heat-affected zone of the heat generated by the cutting is 50 μm. In order to reduce the influence on the flexible substrate 2 by the heat generated by the cutting, the distance H3 between the side of the flexible substrate 2 close to the peripheral region B and the edge of the driving base plate in the second direction is set to be greater than or equal to 50 μm. Certainly, if the cutting process is to be optimized, that distance may be optimized and reduced according to the practical cutting process, and may be decided particularly according to practical situations.

It should be noted that, when the mother board of the driving base plate is cut to obtain the driving base plate, the position where the cutting line is located is exactly the edge position of the driving base plate after the cutting. That the distance H3 between the side of the flexible substrate 2 close to the peripheral region B and the edge of the driving base plate in the second direction is greater than or equal to 50 μm may be understood as that, in the mother board of the driving base plate, the distance from the side of the flexible substrate 2 close to the peripheral region B to the cutting line in the second direction is greater than or equal to 50 μm, and may also be understood as that the distance between the outer contour of the flexible substrate 2 and the outer contour of the peripheral region B is greater than or equal to 50 μm.

In some embodiments, referring to FIG. 4*a*, the driving base plate further comprises a first conductive layer and a second conductive layer, the first conductive layer is located between the first buffer layer 4 and the first passivation layer 6, and the second conductive layer is located between the second passivation layer 8 and the third passivation layer 10.

The first conductive layer is located within the device disposing region A1, the bending region A2 and the bonding region A3, and the second conductive layer is located within the device disposing region A1 and the bonding region A3.

Figure 7B:
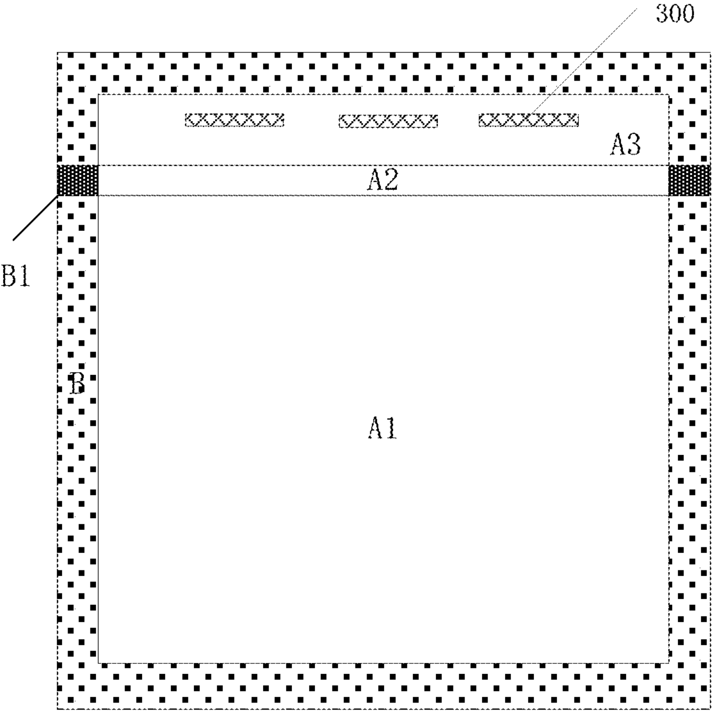
Figure 7C:
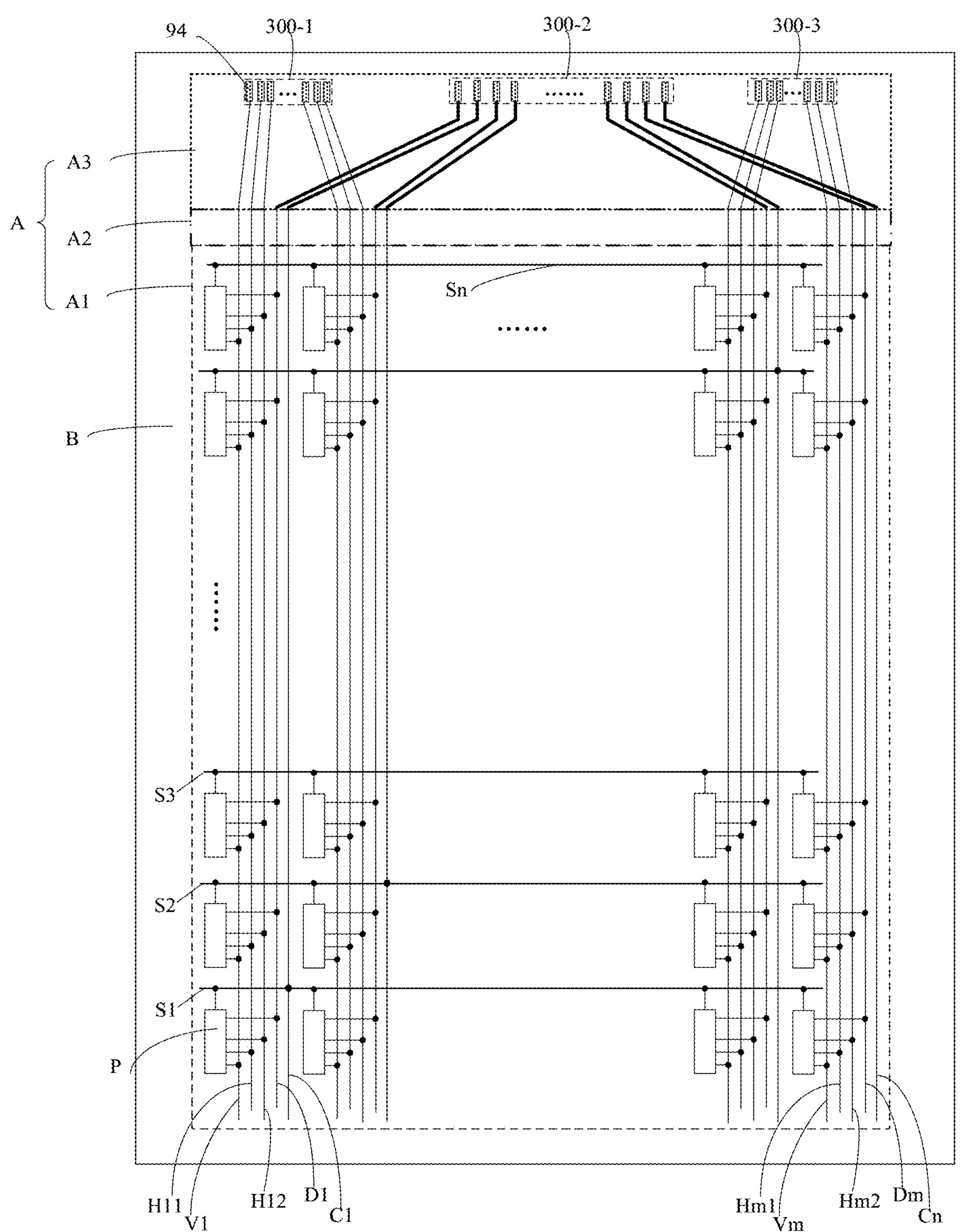

FIG. 7*b* shows a schematic structural diagram of a driving base plate comprising one bonding region A3 and one bending region A2. FIG. 7*c* is a circuit diagram of the driving base plate corresponding to FIG. 7*b*.

Referring to FIG. 7*c*, the device disposing region A1 has a plurality of pixels P arranged in an array, a plurality of scanning lines Sn, a plurality of data lines Dm, a plurality of anode signal lines Hm and a plurality of reference signal lines Vm.

Each of the plurality of pixels P comprises sub-pixels of at least three colors and a pixel driving chip that drives them to emit light. Each of the sub-pixels comprises at least one inorganic light emitting diode. The pixel driving chip is electrically connected to the anode of the inorganic light emitting diode of each of the sub-pixels that it drives, at least one data signal line Dm among the plurality of data lines, at least one scanning line Sn among the plurality of scanning lines and at least one reference signal line Vm among the plurality of reference signal lines.

The pixel driving chip is used to, by the controlling by the scanning line Sn, write the signal of the data signal line Dm into the sub-pixels of the different colors by time division. The reference signal line Vm is used to supply a cathode signal to the pixel driving chip, to cause the pixel driving chip and the inorganic light emitting diode to form an electric-current passage therebetween.

In the driving base plate according to the embodiment of the present application, the inorganic light emitting diode may be a Mini Light Emitting Diode (abbreviated as Mini LED) or Micro Light Emitting Diode (abbreviated as Micro LED), which is not limited herein.

Each of the pixel rows is correspondingly connected to one scanning line Sn among the plurality of scanning lines. Each of the pixel columns corresponds to one data signal line Dm among the plurality of data lines, one reference signal line Vm among the plurality of reference signal lines and two anode signal lines Hm1, Hm2 among the plurality of anode signal lines.

One anode signal line Hm1 of the two anode signal lines Hm1, Hm2 is electrically connected to the anode of the inorganic light emitting diode in a first-color sub-pixel (R), and the other anode signal line Hm2 is electrically connected to the anodes of the inorganic light emitting diodes in a third-color sub-pixel (G) and a second-color sub-pixel (B). Accordingly, the signals received by the anodes of the inorganic light emitting diodes in the third-color sub-pixel (G) and the second-color sub-pixel (B) can be the same, and the amplitude value of the signal received by the anode of the inorganic light emitting diode in the first-color sub-pixel (R) is greater than the amplitude value of the signal received by the sub-pixels of the other two colors, which can prevent that all of the anodes of the sub-pixels of the three colors receive the signal of the highest amplitude value among the signals required by the sub-pixels of the three colors, thereby reducing the power consumption.

The device disposing region A1 further comprises scanning-signal traces Cn that are connected to each of the scanning lines Sn among the plurality of scanning lines correspondingly one to one. The scanning-signal traces Cn are used to supply a scanning signal to the corresponding scanning lines Sn, and therefore the signal source for supplying the scanning signal can be provided at the two ends of the scanning-signal traces Cn, to avoid providing the chip for supplying the scanning signal at the two ends of the scanning lines Sn.

When the quantity N of the pixel rows and the quantity M of the pixel columns within the device disposing region A1 are equal, or, in other words, N=M, one side of each of the pixel columns is correspondingly provided with one scanning-signal trace Cn, and between two neighboring pixel columns is provided merely one scanning-signal trace Cn.

When the quantity N of the pixel rows within the device disposing region A1 is greater than the quantity M of the pixel columns, or, in other words, N>M, the two sides of at least one of the pixel columns are individually provided with at least one scanning-signal trace Cn, and between at least some of two neighboring pixel columns is provided at least one scanning-signal trace Cn.

In a particular implementation, the first color, the second color and the third color may individually be one of the red color, the blue color and the green color. For example, the first color is the red color, the second color is the blue color, and the third color is the green color, which is not limited herein.

It should be noted that the scanning lines Sn are arranged in a same one layer in the first conductive layer, and the scanning-signal traces Cn, the data signal lines Dm, the reference signal lines Vm and the anode signal lines Hm1, Hm2 are arranged in a same one layer in the second conductive layer.

A plurality of bonding electrodes 94 within the bonding region A3 may be grouped into different groups according to the types of the signals that they receive and transmit, and the 20) bonding electrodes grouped into the same one group may be connected to one circuit board, or, particularly, correspondingly connected to the golden fingers on the circuit board. Taking FIG. 7c as an example, the bonding electrodes 94 are grouped into a first bonding-electrode group 300-1, a second bonding-electrode group 300-2 and a third bonding-electrode group 300-3; in other words, three circuit boards are required to be connected to the driving base plate.

The scanning-signal traces Cn and the data signal lines Dm are sequentially connected to the second bonding-electrode group 300-2 by traces located within the bending region A2 and the bonding region A3, and are bonded to and connected to a first circuit board by the second bonding-electrode group 300-2. The reference signal lines Vm and the anode signal lines Hm are sequentially connected to the first bonding-electrode group 300-1 and the third bonding-electrode group 300-3 by traces located within the bending region A2 and the bonding region A3, and are bonded to and connected to two second circuit boards by the first bonding-electrode group 300-1 and the third bonding-electrode group 300-3.

In a particular implementation, in the driving base plate according to the embodiment of the present application, the bonding region A3 may be provided with merely one first circuit board and one second circuit board, which can reduce the quantity of the circuit boards.

The first conductive layer is generally used to provide various signal lines, for example, a common-voltage line GND, a driving-voltage line VLED, a source power-supply line PWR, and an address line D1.

The second conductive layer is generally used to provide the terminals (bonding pads) and the connecting lead wires that are connected to the light emitting devices, and so on.

Figure 6:
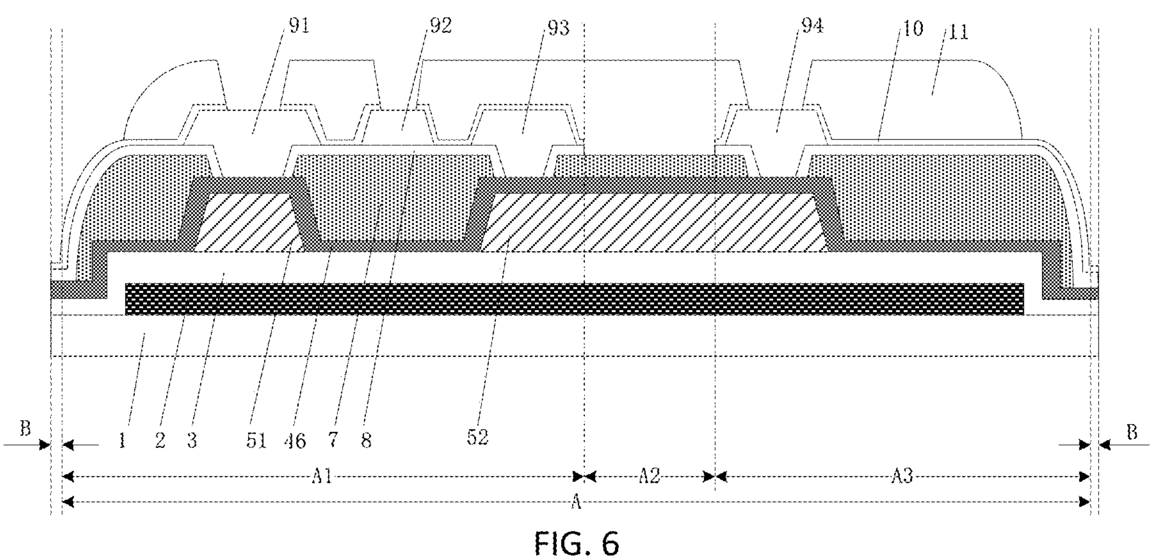

As an example, referring to FIG. 6, the first conductive layer comprises a first lead wire 51 and a second lead wire 52, the second conductive layer comprises a first terminal 91, a second terminal 92 and a bonding terminal 94 whose surfaces are exposed, and a third lead wire 93 whose surface is covered by the second organic layer 11. The first terminal 91 and the second terminal 92 are used to be bonded to and connected to the light emitting device, and the bonding terminal 94 is used to be bonded to and connected to the circuit board. The first lead wire 51 is located within the device disposing region A1, the second lead wire 52 is located within the bending region A2, and the two ends of the second lead wire 52 extend from the bending region A2 to the device disposing region A1 and the bonding region A3. The first terminal 91, the second terminal 92 and the third lead wire 93 are located within the device disposing region A1, the bonding terminal 94 is located within the bonding region A3, the first lead wire 51 and the first terminal 91 are electrically connected, and the second lead wire 52 is electrically connected to the third lead wire 93 and the bonding terminal 94.

In some embodiments, the thickness of the first conductive layer is approximately 1.5 μm-7 μm, and its material may comprise copper. For example, a tandem structure of, for example, MoNb/Cu/MoNb may be formed by sputtering. In that, the material of the side close to the substrate 1 is MoNb, which has a thickness of approximately 300 Å, and is mainly used to increase the adhesive force between the film layers. The material of the intermediate layer of the tandem structure is Cu, which is a preferable material for channels that transmit electric signals. The material of the side that is further from the substrate 1 is MoNb, which has a thickness of approximately 200 Å, and can be used to protect the intermediate layer, to prevent the surface of the intermediate layer, which has a low electrical resistivity, from being exposed to be oxidized. Because the thickness of a single time of sputtering usually does not exceed 1 μm, if it is to manufacture a first conductive layer exceeding 1 μm, multiple times of sputtering are required to form it. Moreover, the first conductive layer may also be formed by electroplating. Particularly, the manufacturing may comprise firstly forming a seed layer by using MoNiTi, so as to increase the nucleation density of the metal crystal grains in the subsequent electroplating, subsequently manufacturing copper of a low electrical resistivity by electroplating, and subsequently manufacturing an anti-oxidation layer, whose material may be MoNiTi.

In some embodiments, the film-layer thickness of the second conductive layer is approximately 6000 Å. The bonding pads (or the terminals) in the second conductive layer are used to bond various electric elements. For example, it may comprise the first terminal 91 and the second terminal 92 located within the device disposing region A1 and used for installing Mini Light Emitting Diode chips, and/or bonding pads (or terminals) used for installing functional elements such as minisized integrated circuit chips or sensors, and the bonding terminal 94 located within the bonding region A3 and used for being connected to the circuit board.

The surface of the side of the bonding pad (or terminal) that is further from the substrate 1 is required to be partially exposed before connected to the electronic elements. In order to prevent the problem that, in the course from the manufacture procedure of the base plate to the manufacture procedure of disposing the electronic elements on the base plate, the bonding pad is exposed in the air and might be oxidized, an anti-oxidation-material layer may be provided merely within the region of the exposed surface of the bonding pad; in other words, the surface of the region of the bonding pad is added one layer as compared with the region where the connecting lead wires (for example, the third lead wire 93) are located. Alternatively, the second conductive layer is overall configured to be of a tandem structure of at least two layers, wherein the material of its film layer that is further from the substrate 1 is an anti-oxidation metal or alloy material, and, particularly, may be formed by a tandem structure of, for example, MoNb/Cu/CuNi. The material MoNb of the bottom layer of the tandem is mainly used to increase the adhesive force. The intermediate layer Cu of the tandem, because of the low electrical resistivity, is mainly used to transmit electric signals. The top layer CuNi of the tandem cannot only prevent oxidation of the intermediate layer, but also can ensure the fastness of the connection with the electronic elements.

Referring to FIGS. 6 and 7c, the first lead wire 51 is connected to the scanning line Sn, and the first lead wire 51 is connected to the anode of the pixel driving chip by the first terminal 91. The second terminal 92 is connected to the reference signal line Vm and the cathode of the pixel driving chip, and the pixel driving chip is connected to the inorganic light emitting diode, therefore forming the electric current driving the pixel driving chip and the inorganic light emitting diode.

In addition, by some of the third lead wires 93, some of the second lead wires 52 and some of the bonding terminals 94, the scanning-signal traces Cn and the data signal lines Dm located within the device disposing region A1 are connected to the first circuit board. By the other third lead wires 93, the other second lead wires 52 and the other bonding terminals 94, the reference signal lines Vm and the anode signal lines Hm located within the device disposing region A1 are connected to the two second circuit boards.

In some embodiments, in the structure of the driving base plate, optionally, as shown in FIG. 6, a buffer layer 46 is provided on the first conductive layer, and the thickness of the buffer layer 46 is the sum of the thicknesses of the first buffer layer 4 and the first passivation layer 6 in the driving base plate shown in FIG. 5.

In some embodiments, referring to FIG. 4*c*, the functional region A comprises a device disposing region A1, a bending region A2 and a bonding region A3, and the bending region A2 is located between the device disposing region A1 and the bonding region A3. The supporting substrate 1 is located within the device disposing region A1 and the bonding region A3, and the driving base plate within the bending region A2 is configured to be capable of bending along a bending axis.

In practical applications, before the driving base plate is bent, it is required to remove the supporting substrate 1 within the bending region A2, so as to form the structure of the driving base plate shown in FIG. 4*c*, and subsequently the bending region is bent. It should be noted that the bending axis is not a real component that exists in the driving base plate, but is merely a concept that is made in order to describe the process of the bending of the driving base plate.

In some embodiments, referring to FIG. 4*c*, when the bending region A2 is in the non-bending state, the surface of the supporting substrate 1 within the device disposing region A1 that is further from the flexible substrate 2 and the surface of the supporting substrate 1 within the bonding region A3 that is further from the flexible substrate 2 are located in the same one plane.

When the bending region A2 is in the bending state, the surface of the supporting substrate 1 within the device disposing region A1 that is further from the flexible substrate 2 and the surface of the supporting substrate 1 within the bonding region A3 that is further from the flexible substrate 2 are fixed together.

Figures 8, 9:
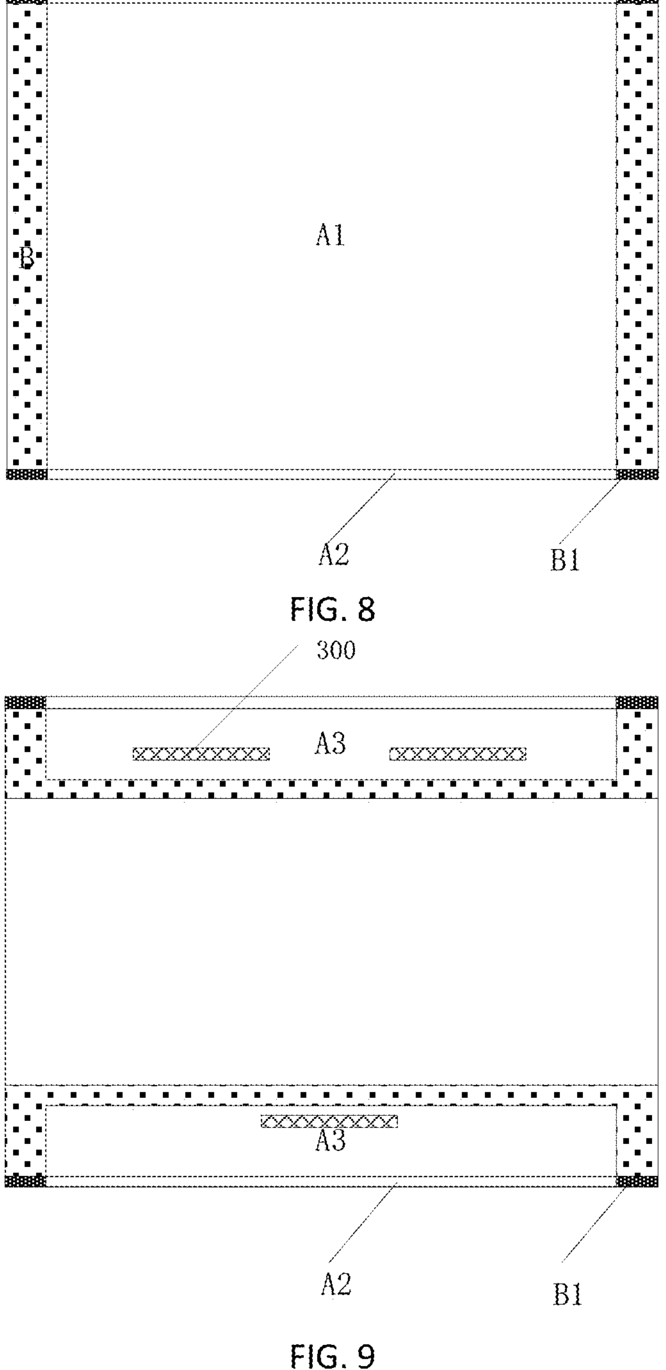
FIGS. 8-9 are two schematic structural diagrams of the driving base plates according to the embodiments of the present application when they are bent.

FIG. 7*a* shows a schematic structural top view of a driving base plate. FIGS. 8 and 9 are schematic structural top views of the front side (the displaying surface) and the back side (the surface opposite to the displaying surface) after the driving base plate shown in FIG. 7*a* has been bent, respectively. Referring to FIG. 7*a*, the driving base plate comprises a functional region A and a peripheral region B surrounding the functional region A. The functional region A comprises one device disposing region A1, two bonding regions A3 and two bending regions A2. The peripheral region B further comprises one peripheral sub-region B1 that can be bent, and the peripheral sub-region B1 is located at an extension position of the bending regions A2. The bonding regions A3 further comprise bonding-terminal groups 300 used for the bonding of the circuit board (I.e., at the position of the second organic layer 11 that exposes the bonding terminal 94 in FIG. 4*c*).

In practical applications, the driving base plate may also comprise one bonding region A3 and one bending region A2, as shown in FIG. 7*b*, and may also comprise three or four bonding regions A3, and may be decided particularly according to practical situations, and is not limited herein. Referring to FIGS. 8 and 9, after the supporting substrate 1 within the bending region A2 has been removed, the driving base plate may be bent in the manner shown in FIG. 8, so as to bend and fix the bonding region A3 and part of the bending region A2 to the back side of the driving base plate, thereby reducing the width of the border frame of the light emitting apparatus manufactured by using the driving base plate, which can be used to manufacture a spliced light emitting apparatus having a narrow seam.

Figure 10:
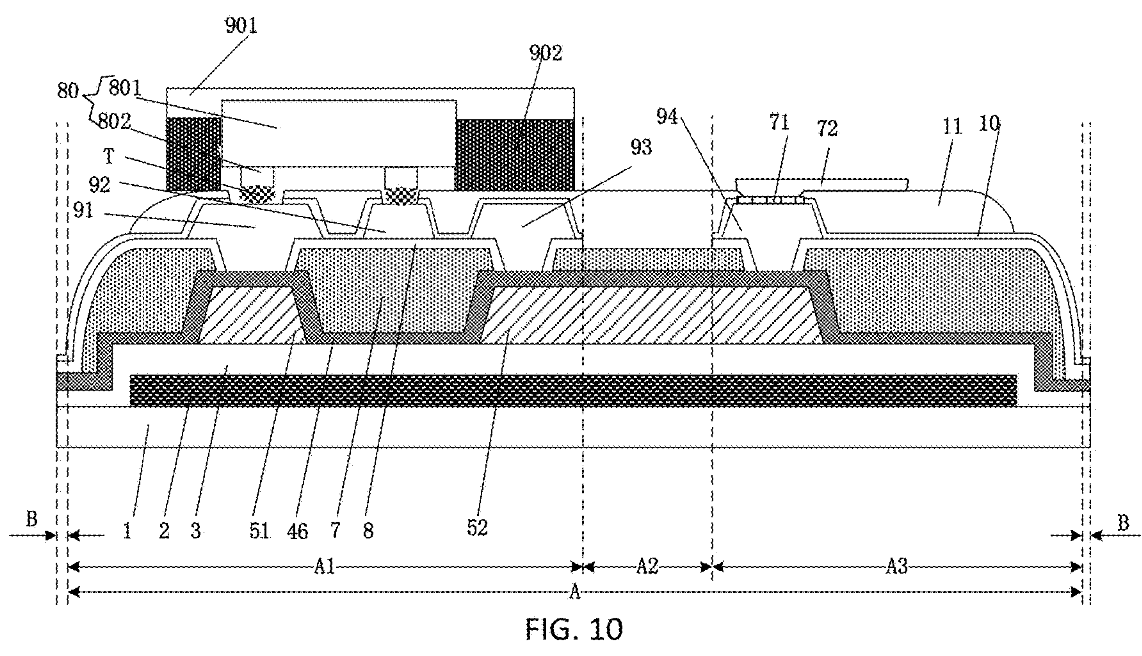
FIG. 10 is a schematic structural diagram of a light emitting apparatus according to an embodiment of the present application.

An embodiment of the present application further provides a light emitting apparatus. Referring to FIG. 10, the light emitting apparatus comprises a light emitting device 80, a circuit board 72 and the driving base plate stated above. The driving base plate is electrically connected to the light emitting device 80 and the circuit board 72.

The light emitting device comprises a pixel driving chip and an inorganic light emitting diode (801 is the pixel driving chip and the inorganic light emitting diode). The inorganic light emitting diode may be a miniaturized LED, for example, a Mini LED or a Micro LED. The circuit board may be a flexible circuit board (FPC), a printed circuit board (PCB), a programmable logic array (FPGA) and so on.

Particularly, two leads 802 of the light emitting device 80 are electrically connected to the first terminal 91 and the second terminal 92 within the device disposing region A1 by a soldering material T (for example, a tin solder), and the circuit board 72 is electrically connected to the bonding terminal 94 within the bonding region A3 by an anisotropic conductive adhesive 71. The light emitting device 80 is further provided with a protecting component 901, wherein the protecting component 901 may employ a transparent-resin material or a colored-resin material, as long as the emitted-light color of the light emitting device 80 is not affected; and an anti-interference component 902 located between two neighboring light emitting devices 80. The material of the anti-interference component 902 may be a dark-color resin, which can prevent mutual interference between the light rays emitted by the two neighboring light emitting devices, and absorb the external ambient light, thereby preventing the problems such as decrease in the contrast caused by the reflection of the ambient light entering the metal film layers.

In practical applications, according to the different types of the light emitting devices, the light emitting apparatus may be used as a backlight device, and may also be used as a displaying device. Particularly, if all of the plurality of light emitting devices in the light emitting apparatus are light emitting devices that emit a blue light, then the light emitting apparatus may be used as a backlight device. If the plurality of light emitting devices in the light emitting apparatus include three types of light emitting devices emitting a red light, emitting a green light and emitting a blue light, then the light emitting apparatus may be used as a displaying device.

In the light emitting apparatus according to the embodiment of the present application, because the protecting layer in the light emitting apparatus covers the surface of the flexible substrate that is further from the supporting substrate and the side of the flexible substrate close to the peripheral region, it is prevented that the side of the flexible substrate contacts the water vapor in the environment, thereby increasing the adhesive force between the part of the flexible substrate close to the peripheral region and the supporting substrate, and ameliorating the problem of swelling and disengagement of the part of the flexible substrate close to the peripheral region, which improves the reliability of the display products manufactured by using the driving base plate.

Figure 11:
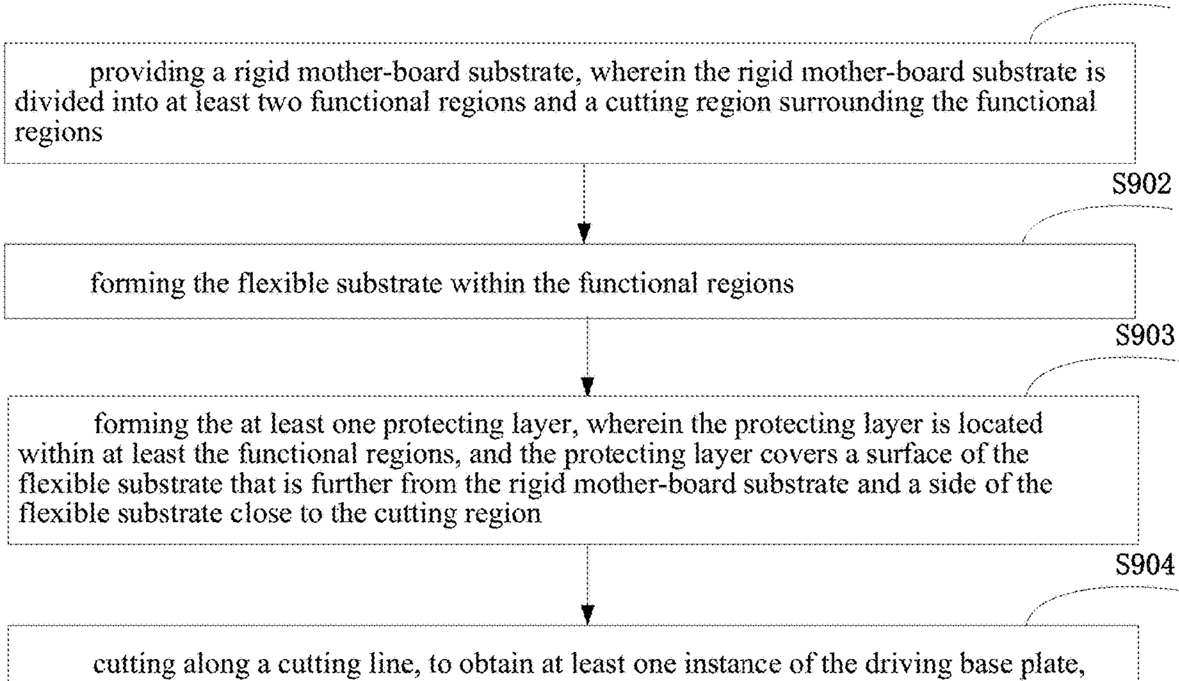
FIG. 11 is a flow chart of a method for manufacturing the driving base plate according to an embodiment of the present application.
Figures 11A, 12, 12B, 13A, 13B:
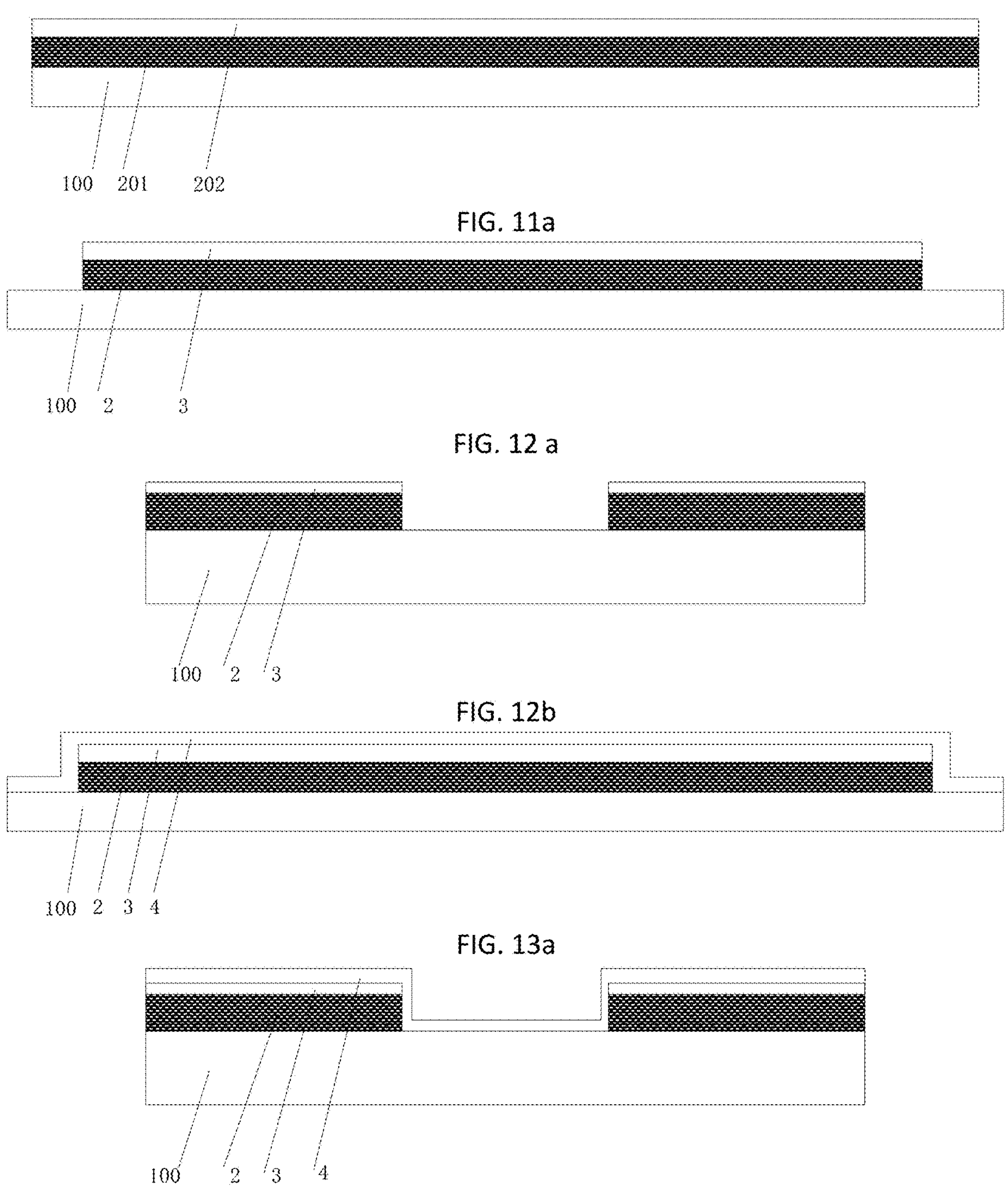

An embodiment of the present application further provides a method for manufacturing the driving base plate. Referring to FIG. 11, the method comprises:

S901: providing a rigid mother-board substrate 100 shown in FIG. 11*a*, wherein the rigid mother-board substrate 100 is divided into at least two functional regions A and a cutting region surrounding the functional regions A.

S902: forming the flexible substrate 2 within the functional regions A.

S903: forming the at least one protecting layer, wherein the protecting layer is located within at least the functional regions A, and the protecting layer covers the surface of the flexible substrate 2 that is further from the rigid mother-board substrate 100 and the side of the flexible substrate 2 close to the cutting region.

S904: cutting along a cutting line, to obtain at least one instance of the driving base plate, wherein the cutting line is located within the cutting region.

It should be noted that, before the rigid mother-board substrate is cut, all of the areas other than the functional regions A are the cutting region. After the cutting, part of the cutting region is cut, and part of the cutting region is maintained at the periphery of the functional regions A, as the peripheral region B of the driving base plate.

The embodiment of the present application provides a method for manufacturing the driving base plate. In the driving base plate manufactured by using the method, because the protecting layer covers the surface of the flexible substrate 2 that is further from the supporting substrate 1 and the side of the flexible substrate 2 close to the peripheral region B, it is prevented that the side of the flexible substrate 2 contacts the water vapor in the environment, thereby increasing the adhesive force between the part of the flexible substrate 2 close to the peripheral region B and the supporting substrate 1, and ameliorating the problem of swelling and disengagement of the part of the flexible substrate 2 close to the peripheral region B, which improves the reliability of the display products manufactured by using the driving base plate.

In some embodiments, the functional regions B of the driving base plate further comprise a second buffer layer 4, and the method further comprises:

S9020: forming the flexible substrate 2 and the second buffer layer 3 simultaneously, wherein the second buffer layer 3 is located between the flexible substrate 2 and the protecting layer, and the orthographic projection of the second buffer layer 3 on the supporting substrate 1 overlaps with the orthographic projection of the flexible substrate 2 on the supporting substrate 1.

Optionally, the step S9020 of forming the flexible substrate 2 and the second buffer layer 3 simultaneously comprises:

S9021: referring to FIG. 11*a*, forming a flexible thin film 201 on the rigid mother-board substrate 100, wherein the flexible thin film 201 is located within the functional regions A and the cutting region.

S9022: forming the second buffer thin film 202 on the flexible thin film 201, wherein the second buffer thin film 202 covers the flexible thin film 201.

S9023: performing patterning treatment to the second buffer thin film 202 and the flexible thin film 201 simultaneously, to obtain the flexible substrate 2 and the second buffer layer 3.

In the related art, the patterning treatment of the flexible substrate has three modes, particularly including:

In the first mode, the flexible substrate within the cutting region is removed by means of laser cutting and excavation. However, because the flexible substrate (PI) is an organic matter, the laser light might cause ablation of the flexible substrate. Therefore, this mode has very harsh requirements on the process conditions of the laser cutting, and the driving base plate manufactured by using this method has a low product yield.

In the second mode, the flexible substrate within the cutting region is removed by means of dry etching. Because the thickness of the flexible substrate is usually greater than 3 μm, when the flexible substrate within the peripheral region B is removed by dry etching, a photoresist-material layer whose thickness exceeds the thickness of the flexible substrate is required to serve as the mask (for example, a 5 μm flexible substrate requires a 7 μm photoresist-material layer), or else Mura caused by ununiform etching happens, which seriously affects the product quality. Furthermore, this mode also has very high requirements on the process conditions of the etching.

In the third mode, the flexible substrate within the cutting region is cut and removed by using a knife flywheel. However, the knife head of the knife flywheel easily adheres to the flexible substrate, to result in ununiform cutting, whereby the flexible substrate of the cutting region is not thoroughly removed, and has the problem of residue.

However, by using the method according to the present application, the second buffer thin film 202 is formed on the flexible thin film 201, subsequently a thin patterned PR adhesive is formed on the second buffer thin film 202, the second buffer thin film 202 and the flexible thin film 201 are etched simultaneously by using the patterned PR adhesive as the mask, and, simultaneously, the second buffer thin film 202 serves as an auxiliary hard mask, to assist in etching the flexible thin film 201. Because the second buffer thin film 202 is manufactured by using an inorganic material, in the dry etching, the speeds of the etching by the gas to the organic material and the inorganic material are unequal, and a thin PR adhesive can be formed, which reduces the difficulty in the manufacturing process, and accordingly forms simultaneously the intermediate structure for manufacturing the driving base plate shown in FIG. 12*b*. The flexible substrate 2 formed by using the manufacturing method according to the present application has a simple manufacturing process, a low difficulty in the manufacturing process, and a high product yield.

The etching employs the ICP (Inductively Coupled Plasma) etching technique, and the etching is performed in the conditions of oxygen and plasma treatment. After the etching, the flexible substrate 2 with the angle of gradient of 90° C. an be obtained.

In some embodiments, the protecting layer comprises a first buffer layer 4, and the step S903 of forming the at least one protecting layer comprises:

S9031: forming the first buffer layer 4, wherein the first buffer layer 4 is located within at least the functional regions A, and the first buffer layer A covers the surface of the flexible substrate 2 that is further from the supporting substrate 1 and the side of the flexible substrate 2 close to the cutting region.

The first buffer layer 4 may be located merely within the functional regions A. Alternatively, the first buffer layer 4 may be located within the functional regions A, and cover the surface of the flexible substrate 2 that is further from the supporting substrate 1 and the side of the flexible substrate 2 close to the cutting region, and may also be located within the cutting region, and cover the supporting substrate 1 within the cutting region.

In the driving base plate manufactured by using the manufacturing method according to the present application, by configuring that the first buffer layer 4 covers the surface of the flexible substrate 2 that is further from the supporting substrate 1 and the side of the flexible substrate 2 close to the peripheral region B, it is prevented that the side of the flexible substrate 2 contacts the water vapor in the environment, thereby increasing the adhesive force between the part of the flexible substrate 2 close to the peripheral region B and the supporting substrate 1, and ameliorating the problem of swelling and disengagement between the part of the flexible substrate 2 close to the peripheral region B and the supporting substrate 1, which improves the reliability of the display products manufactured by using the driving base plate.

Figures 14A, 14B, 15A, 15B:
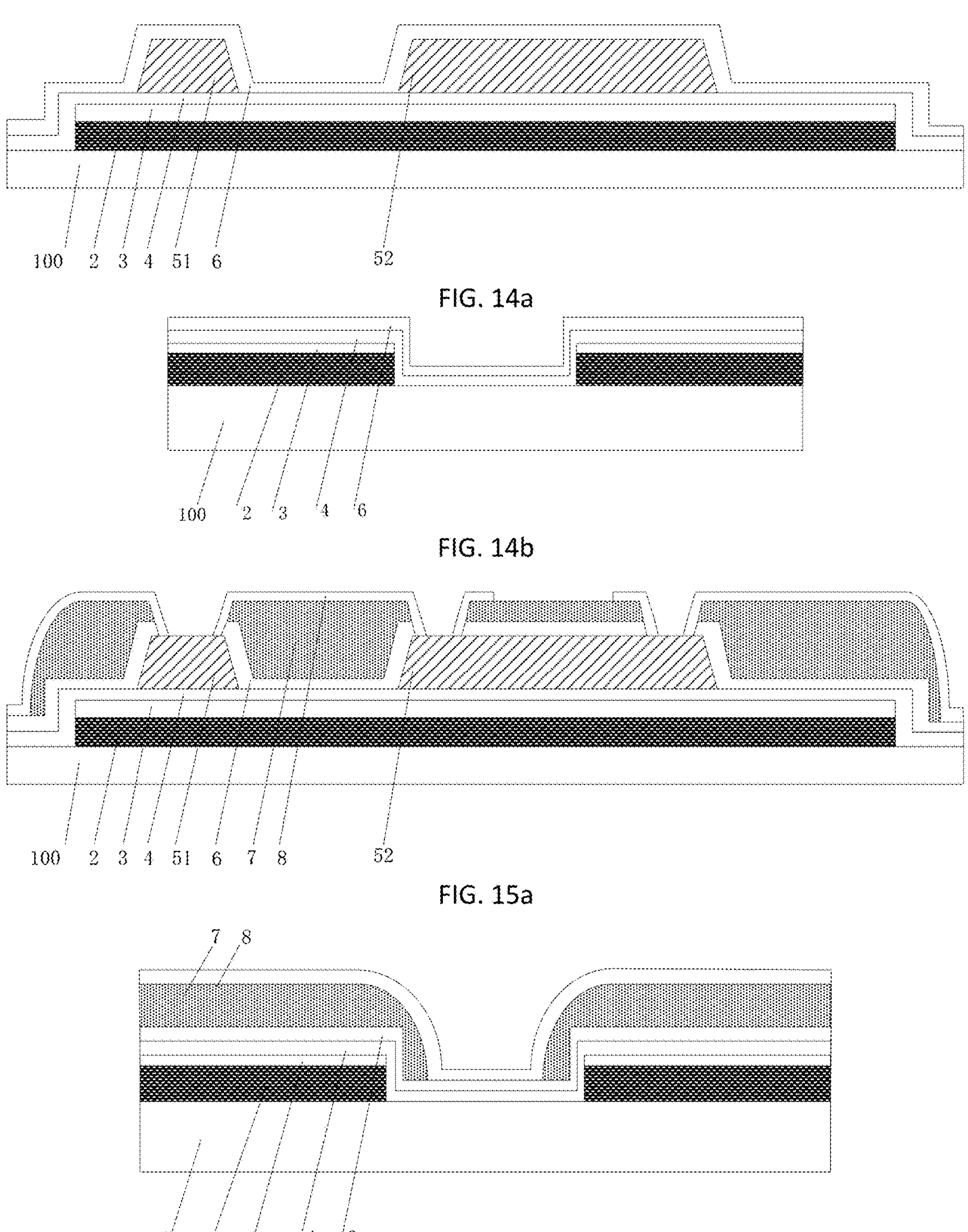

In some embodiments, after the step S9031 of forming the first buffer layer 4, and before the step S904 of cutting along the cutting line, to obtain at least one instance of the driving base plate, the method further comprises:

S905: referring to FIG. 14*a*, forming the first conductive layer, wherein the first conductive layer is located on the side of the first buffer layer 4 that is further from the supporting substrate 1, and the first conductive layer is located within the device disposing region A1, the bending region A2 and the bonding region A3.

The first conductive layer comprises the first lead wire 51 and the second lead wires 52. The first lead wire 51 is located within the device disposing region A1. The second lead wire 52 is located within the bending region A2, and the two ends of the second lead wire 52 extend from the bending region A2 to the device disposing region A1 and the bonding region A3.

S905: forming the first passivation layer 6 on the first conductive layer, wherein the first passivation layer 6 is located within the device disposing region A1, the bending region A2, the bonding region A3 and the cutting region.

Because the orthographic projection of the first passivation layer 6 on the supporting substrate 1 and the orthographic projection of the first buffer layer 4 on the supporting substrate 1 overlap, the first passivation layer 6 also covers the side of the flexible substrate 2 close to the peripheral region B, thereby further improving the effect of the blocking of water vapor, and preventing the problem of swelling and disengagement caused by contacting of the side of the flexible substrate 2 with the water vapor in the environment.

S907: forming a first organic layer 7 on the first passivation layer 6.

The first organic layer 7 has a first via hole, a second via hole and a third via hole in the direction perpendicular to the rigid mother-board substrate 100. The first via hole exposes part of the area of the first lead wire 51. The second via hole exposes part of the area of the second lead wire 52 located within the device disposing region A1. The third via hole exposes part of the area of the second lead wire 52 located within the bonding region A3.

The first organic layer 7 does not overlap with the rigid mother-board substrate 100 within the cutting region in the direction perpendicular to the flexible substrate 2. Accordingly, in the manufacturing of the driving base plate, when the rigid mother-board substrate 100 is cut to obtain the driving base plate, the first organic layer 7 is far from the cutting line, thereby preventing the heat caused by the cutting from affecting the first organic layer 7, and reducing the difficulty in the cutting process.

In some embodiments, the step S907 of forming the first organic layer 7 on the first passivation layer 6 comprises:

S9071: forming a first organic thin film on the first passivation layer 7.

S9072: performing patterning treatment to the first organic thin film, to obtain the first organic layer 7, wherein the orthographic projection of the first organic layer 7 on the rigid mother-board substrate 100 is located within the orthographic projection of the flexible substrate 2 on the rigid mother-board substrate 100, or the first organic layer 7 covers the surface of the flexible substrate 2 that is further from the rigid mother-board substrate 100 and the side of the flexible substrate 2 close to the cutting regions B.

In some embodiments, after the step S907 of forming the first organic layer 7 on the first passivation layer 6, and before the step S904 of cutting along the cutting line, to obtain at least one instance of the driving base plate, the method further comprises:

S908: forming a second passivation layer 8 on the first organic layer 7.

S909: forming the second conductive layer on the second passivation layer 8, wherein the second conductive layer is located within the device disposing region A1 and the bonding region A3.

S910: forming a third passivation layer 10 on the second conductive layer, wherein both of the second passivation layer 8 and the third passivation layer 10 are located within the device disposing region A1, the bonding region A3 and the cutting region.

S911: forming a second organic layer 11 on the third passivation layer 8, wherein the orthographic projection of the second organic layer 11 on the rigid mother-board substrate 100 overlaps with at least the orthographic projection of the flexible substrate 2 on the rigid mother-board substrate 100.

The second conductive layer comprises the first terminal 91, the second terminal 92, the third lead wire 93 and the bonding terminal 94, the first terminal 91, the second terminal 92 and the third lead wire 93 are located within the device disposing region A1, the bonding terminal 94 is located within the bonding region A3, the first lead wire 51 is electrically connected to the first terminal 91 by the first via hole, and the second lead wire 52 is electrically connected to the third lead wire 93 by the second via hole and electrically connected to the bonding terminal 94 by the third via hole.

The second organic layer 11 comprises a fourth via hole, a fifth via hole and a sixth via hole in the direction perpendicular to the rigid mother-board substrate 100. The fourth via hole exposes part of the area of the first terminal 91. The fifth via hole exposes part of the area of the second terminal 92. The sixth via hole exposes part of the area of the third lead wire 93. A seventh via hole exposes part of the area of the bonding terminal 94. In the driving base plate according to the embodiment of the present application, because the first passivation layer 6 and the first buffer layer 4 overlap in the direction perpendicular to the supporting substrate 1, when subsequently the second passivation layer 8 and the third passivation layer 10 are provided on the first passivation layer 6, the second passivation layer 8 and the third passivation layer 10 that are located within the device disposing region A1, the bonding region A3 and the peripheral region B also overlap with the first buffer layer 4 in the direction perpendicular to the supporting substrate 1, so that the second passivation layer 8 and the third passivation layer 10 also cover the side of the flexible substrate 2 close to the peripheral region B, thereby further improving the effect of the blocking of water vapor.

The method for manufacturing the driving base plate will be described particularly below by taking the structure shown in FIG. 4*a* as an example, comprising:

S1: referring to FIG. 11*a*, supplying the rigid mother-board substrate 100.

S2: forming a first flexible thin film 201 on the rigid mother-board substrate 100.

S3: forming a second buffer thin film 202 on the flexible thin film 201.

S4: performing patterning treatment to the second buffer thin film 202 and the flexible thin film 201 simultaneously, to obtain the flexible substrate 2 and the second buffer layer 3 shown in FIG. 12*a* or 12*b*.

It should be noted that FIG. 12*a* is obtained by cutting the structure in FIG. 12*b*. The manufacturing method according to the embodiments of the present application firstly forms the 20) film layers on the rigid mother-board substrate 100, and subsequently cuts to obtain the driving base plate. The processes of forming the film layers on the rigid mother-board substrate 100 are similar to the processes of forming the film layers on the driving base plate, and thus are not described particularly herein. In practical applications, usually firstly the film layers are formed on the rigid mother-board substrate 100, and after the film layers have been completely manufactured, they are cut to obtain the at least one driving base plate.

S5: referring to FIG. 13*a* or 13*b*, forming the first buffer layer 4 on the second buffer layer 3, wherein FIG. 13*a* is obtained by cutting the structure in FIG. 13*b*. The relation between FIGS. 13*a* and 13*b* is similar to the relation between FIGS. 12*a* and 12*b*, and is not discussed further herein.

S6: forming the first lead wire 51 and the second lead wire 52 shown in FIG. 14*a* on the first buffer layer 4, wherein FIG. 14*a* is obtained by cutting the structure in FIG. 14*b*.

S7: forming the first passivation layer 6 on the first lead wire 51 and the second lead wire 52.

S8: forming the first organic layer 7 shown in FIG. 15*a* on the first passivation layer 6.

S9: forming the second passivation layer 8 shown in FIG. 15*a* on the first organic layer 7, wherein FIG. 15*a* is obtained by cutting the structure in FIG. 15*b*.

Figure 16A:
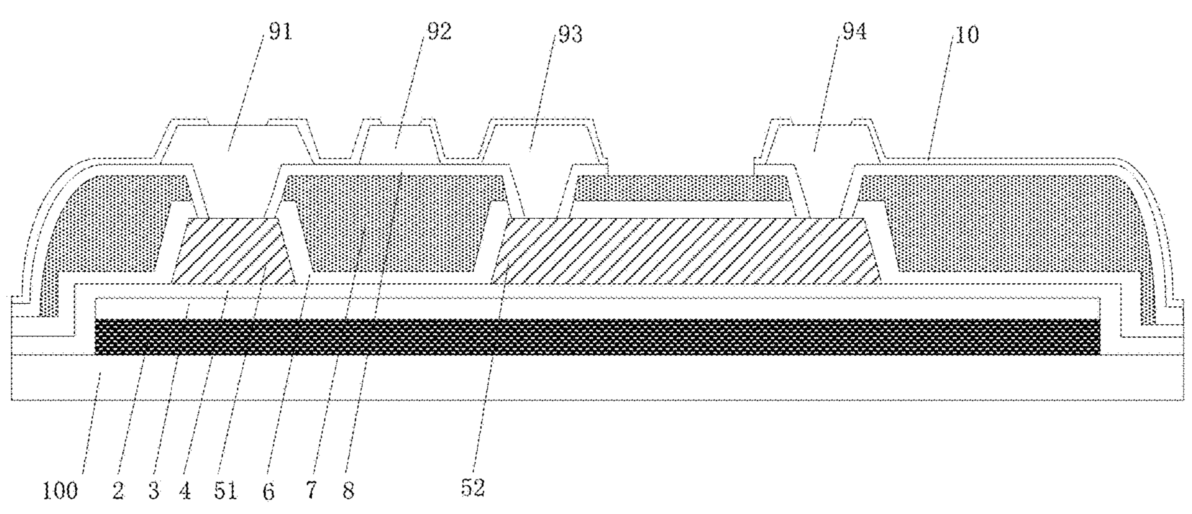

S10: forming the first terminal 91, the second terminal 92, the third lead wire 93 and the bonding terminal 94 shown in FIG. 16*a* on the second passivation layer 8.

The first terminal 91, the second terminal 92 and the third lead wire 93 are located within the device disposing region A1, the bonding terminal 94 is located within the bonding region A3, the first lead wire 51 and the first terminal 91 are electrically connected, and the second lead wire 52 is electrically connected to the third lead wire 93 and the bonding terminal 94.

Figure 16B:
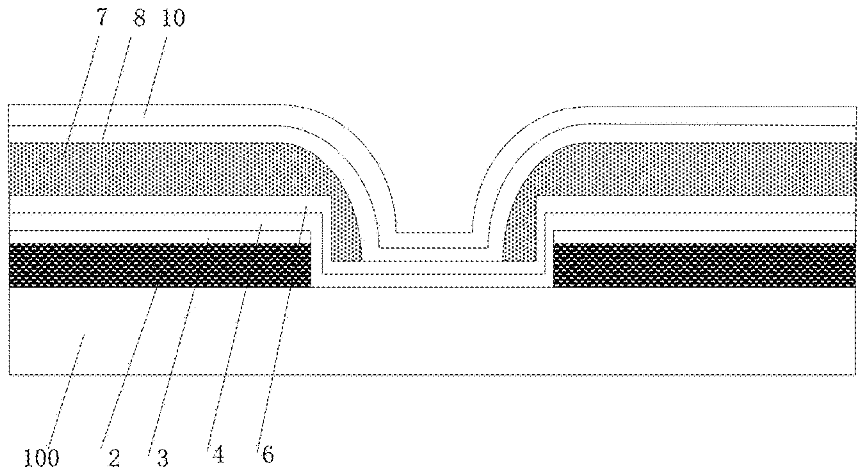

S11: forming the third passivation layer 10 on the first terminal 91, the second terminal 92, the third lead wire 93 and the bonding terminal 94, wherein FIG. 16*a* is obtained by cutting the structure in FIG. 16*b*.

The above are merely particular embodiments of the present application, and the protection scope of the present application is not limited thereto. All of the variations or substitutions that a person skilled in the art can easily envisage within the technical scope disclosed by the present application should fall within the protection scope of the present application. Therefore, the protection scope of the present application should be subject to the protection scope of the claims.

The invention claimed is:

1. A driving base plate comprising a functional region and a peripheral region surrounding the functional region, wherein:

both of the functional region and the peripheral region comprise a supporting substrate, and the functional region further comprises a flexible substrate and at least one protecting layer that are sequentially arranged on the supporting substrate;

a region of an orthographic projection of the flexible substrate on the supporting substrate is located within a region where the supporting substrate of the functional region is located, and the protecting layer covers a surface of the flexible substrate that is further from the supporting substrate and a side of the flexible substrate close to the peripheral region;

the protecting layer comprises a first buffer layer, and the first buffer layer covers the surface of the flexible substrate that is further from the supporting substrate and the side of the flexible substrate close to the peripheral region;

the functional region comprises a device disposing region, a bending region and a bonding region, and the bending region is located between the device disposing region and the bonding region; and all of the device disposing region, the bending region and the bonding region are provided with the flexible substrate and the first buffer layer; and when the bending region is in a bending state, a surface of the supporting substrate within the device disposing region that is further from the flexible substrate and a surface of the supporting substrate within the bonding region that is further from the flexible substrate are fixed together.

2. The driving base plate according to claim 1, wherein a material of the protecting layer comprises an inorganic material.

3. The driving base plate according to claim 1, wherein a distance between a side of the flexible substrate close to the peripheral region and an edge of the driving base plate in a second direction is greater than or equal to 50 μm, wherein the second direction refers to a direction from the side of the flexible substrate close to the peripheral region pointing to a side of the protecting layer close to the peripheral region.

4. The driving base plate according to claim 1, wherein a region of an orthographic projection of the first buffer layer on the supporting substrate overlaps with the peripheral region, and the first buffer layer directly contacts the supporting substrate within the peripheral region.

5. The driving base plate according to claim 1, wherein the functional region further comprises a second buffer layer; and the second buffer layer is located between the flexible substrate and the first buffer layer, and an orthographic projection of the second buffer layer on the supporting substrate overlaps with the orthographic projection of the flexible substrate on the supporting substrate.

6. The driving base plate according to claim 1, wherein the functional region and the peripheral region further comprise a second buffer layer;

the second buffer layer is located between the supporting substrate and the first buffer layer; and the second buffer layer covers at least the surface of the flexible substrate that is further from the supporting substrate and the side of the flexible substrate close to the peripheral region.

7. The driving base plate according to claim 1, wherein the functional region and the peripheral region further comprise a first passivation layer; and an orthographic projection of the first passivation layer on the supporting substrate overlaps with an orthographic projection of the first buffer layer on the supporting substrate.

8. The driving base plate according to claim 7, wherein the functional region further comprises a first organic layer, the first organic layer is located on one side of the first passivation layer that is further from the flexible substrate, and a region of an orthographic projection of the first organic layer on the supporting substrate does not overlap with the peripheral region.

9. The driving base plate according to claim 1, wherein the supporting substrate is located within the device disposing region and the bonding region, and the driving base plate within the bending region is configured to be capable of bending along a bending axis.

10. A light emitting apparatus, wherein the light emitting apparatus comprises a light emitting device, a circuit board and the driving base plate according to claim 1; and the driving base plate is electrically connected to the light emitting device and the circuit board.

11. The driving base plate according to claim 7, wherein the functional region and the peripheral region further comprise a first organic layer; and an orthographic projection of the first organic layer on the supporting substrate covers the orthographic projection of the flexible substrate on the supporting substrate, and further covers the orthographic projection on the supporting substrate of the first passivation layer located within the peripheral region.

12. The driving base plate according to claim 7, wherein all of the device disposing region, the bending region and the bonding region are provided with the first passivation layer; and all of the device disposing region, the bonding region and the peripheral region comprise a second passivation layer and a third passivation layer, the second passivation layer is located on one side of the first passivation layer that is further from the flexible substrate, an orthographic projection of the third passivation layer on the supporting substrate covers an orthographic projection of the second passivation layer on the supporting substrate, and neither of the orthographic projection of the second passivation layer on the supporting substrate and the orthographic projection of the third passivation layer on the supporting substrate overlaps with the orthographic projection on the supporting substrate of the flexible substrate within the bending region.

13. The driving base plate according to claim 12, wherein the driving base plate further comprises a first conductive layer and a second conductive layer, the first conductive layer is located between the first buffer layer and the first passivation layer, and the second conductive layer is located between the second passivation layer and the third passivation layer; and the first conductive layer is located within the device disposing region, the bending region and the bonding region, and the second conductive layer is located within the device disposing region and the bonding region.

14. A method for manufacturing a driving base plate, wherein the driving base plate comprises a functional region and a peripheral region surrounding the functional region, wherein both of the functional region and the peripheral region comprise a supporting substrate, and the functional region further comprises a flexible substrate and at least one protecting layer that are sequentially arranged on the supporting substrate, wherein a region of an orthographic projection of the flexible substrate on the supporting substrate is located within a region where the supporting substrate of the functional region is located, and the protecting layer covers a surface of the flexible substrate that is further from the supporting substrate and a side of the flexible substrate close to the peripheral region, and wherein the method comprises:

providing a rigid mother-board substrate, wherein the rigid mother-board substrate is divided into at least two functional regions and a cutting region surrounding the functional regions;

forming the flexible substrate within the functional regions;

forming the at least one protecting layer, wherein the protecting layer is located within at least the functional regions, and the protecting layer covers a surface of the flexible substrate that is further from the rigid mother-board substrate and a side of the flexible substrate close to the cutting region; and cutting along a cutting line, to obtain at least one instance of the driving base plate, wherein the cutting line is located within the cutting region.

15. The method according to claim 14, wherein the functional regions further comprise a second buffer layer; and the method further comprises:

forming the flexible substrate and the second buffer layer simultaneously within the functional regions, wherein the second buffer layer is located between the flexible substrate and the protecting layer, and an orthographic projection of the second buffer layer on the rigid mother-board substrate overlaps with an orthographic projection of the flexible substrate on the rigid mother-board substrate.

16. The method according to claim 14, wherein the protecting layer comprises a first buffer layer, and the step of forming the at least one protecting layer comprises:

forming the first buffer layer, wherein the first buffer layer is located within at least the functional regions, and the first buffer layer covers the surface of the flexible substrate that is further from the supporting substrate and the side of the flexible substrate close to the cutting region.

17. The method according to claim 16, wherein after the step of forming the first buffer layer, and before the step of cutting along the cutting line, to obtain at least one instance of the driving base plate, the method further comprises:

forming a first conductive layer, wherein the first conductive layer is located on one side of the first buffer layer that is further from the rigid mother-board substrate, and the first conductive layer is located within the device disposing region, the bending region and the bonding region;

forming the first passivation layer on the first conductive layer, wherein the first passivation layer is located within a device disposing region, a bending region, a bonding region and the cutting region; and forming a first organic layer on the first passivation layer, wherein the first organic layer does not overlap with the rigid mother-board substrate within the cutting region in a direction perpendicular to the flexible substrate.

18. The method according to claim 17, wherein the step of forming the first organic layer on the first passivation layer comprises:

forming a first organic thin film on the first passivation layer; and performing patterning treatment to the first organic thin film, to obtain the first organic layer, wherein an orthographic projection of the first organic layer on the rigid mother-board substrate is located within an orthographic projection of the flexible substrate on the rigid mother-board substrate, or the first organic layer covers the surface of the flexible substrate that is further from the rigid mother-board substrate and a side of the flexible substrate close to the cutting regions.

19. The method according to claim 17, wherein after the step of forming the first organic layer on the first passivation layer, and before the step of cutting along the cutting line, to obtain at least one instance of the driving base plate, the method further comprises:

forming a second passivation layer on the first organic layer;

forming a second conductive layer on the second passivation layer, wherein the second conductive layer is located within the device disposing region and the bonding region;

forming a third passivation layer on the second conductive layer, wherein both of the second passivation layer and the third passivation layer are located within the device disposing region, the bonding region and the cutting region; and forming a second organic layer on the third passivation layer, wherein an orthographic projection of the second organic layer on the rigid mother-board substrate overlaps with at least an orthographic projection of the flexible substrate on the rigid mother-board substrate.

* * * * *